United States Patent
Kim et al.

(10) Patent No.: US 11,575,018 B2
(45) Date of Patent: Feb. 7, 2023

(54) SEMICONDUCTOR DEVICES AND METHODS OF MANUFACTURING THE SAME

(71) Applicant: Samsung Electronics Co., Ltd., Suwon-si (KR)

(72) Inventors: Juyoun Kim, Suwon-si (KR); Sangjung Kang, Suwon-si (KR); Jinwoo Kim, Hwaseong-si (KR); Junmo Park, Seoul (KR); Seulgi Yun, Hwaseong-si (KR)

(73) Assignee: Samsung Electronics Co., Ltd.

( * ) Notice: Subject to any disclaimer, the term of this patent is extended or adjusted under 35 U.S.C. 154(b) by 88 days.

(21) Appl. No.: 17/153,464

(22) Filed: Jan. 20, 2021

(65) Prior Publication Data

US 2021/0328038 A1 Oct. 21, 2021

(30) Foreign Application Priority Data

Apr. 16, 2020 (KR) ........................ 10-2020-0045923

(51) Int. Cl.
*H01L 29/49* (2006.01)
*H01L 27/092* (2006.01)
(Continued)

(52) U.S. Cl.
CPC ........ *H01L 29/4966* (2013.01); *H01L 27/092* (2013.01); *H01L 29/42392* (2013.01); *H01L 29/78696* (2013.01)

(58) Field of Classification Search
CPC ............... H01L 29/4966; H01L 27/092; H01L 29/42392; H01L 29/78696; H01L 21/823842; H01L 27/088; H01L 29/0673; H01L 29/401; H01L 29/513; H01L 29/66439; H01L 29/775; H01L 21/82345; H01L 21/02175; H01L 21/28088; H01L 21/823431; H01L 21/823456; H01L 21/823462; H01L 27/0886; H01L 29/66772; H01L 29/66795; H01L 29/785; H01L 29/78654; B82Y 10/00
(Continued)

(56) References Cited

U.S. PATENT DOCUMENTS 8,404,530 B2 3/2013 Ando et al.
8,772,114 B2 7/2014 Chuang et al.
(Continued)

*Primary Examiner* — Tong-Ho Kim
(74) *Attorney, Agent, or Firm* — Myers Bigel, P.A.

(57) ABSTRACT

A semiconductor memory device includes a substrate having a first region and a second region. A first gate electrode layer is on the first region and includes a first conductive layer including a first plurality of layers, and includes a first upper conductive layer on the first conductive layer. A second gate electrode layer is on the second region and includes a second conductive layer including a second plurality of layers, and includes a second upper conductive layer on the second conductive layer. At least one of the first plurality of layers includes titanium oxynitride (TiON). A first transistor including the first gate electrode layer and a second transistor including the second gate electrode layer are metal oxide semiconductor field effect transistors (MOSFETs) having the same channel conductivity type, and a threshold voltage of the first transistor is smaller than a threshold voltage of the second transistor.

18 Claims, 28 Drawing Sheets

(51) Int. Cl.
*H01L 29/423* (2006.01)
*H01L 29/786* (2006.01)

(58) Field of Classification Search
USPC .......................................................... 257/369
See application file for complete search history.

(56) References Cited

U.S. PATENT DOCUMENTS

| | | |
|---|---|---|
| 9,024,299 B2 | 5/2015 | Li et al. |
| 9,040,404 B2 | 5/2015 | Ando et al. |
| 9,177,870 B2 | 11/2015 | Chuang et al. |
| 10,504,789 B1 | 12/2019 | Tsai et al. |
| 2014/0051003 A1 | 2/2014 | Esswein et al. |
| 2016/0355656 A1 | 12/2016 | Luo et al. |
| 2017/0021318 A1 | 1/2017 | McIver et al. |
| 2017/0159894 A1 | 6/2017 | Jiang |
| 2017/0293763 A1 | 10/2017 | Shear et al. |
| 2017/0335718 A1 | 11/2017 | McCune et al. |
| 2018/0374926 A1* | 12/2018 | Lee ..................... H01L 27/1251 |

* cited by examiner

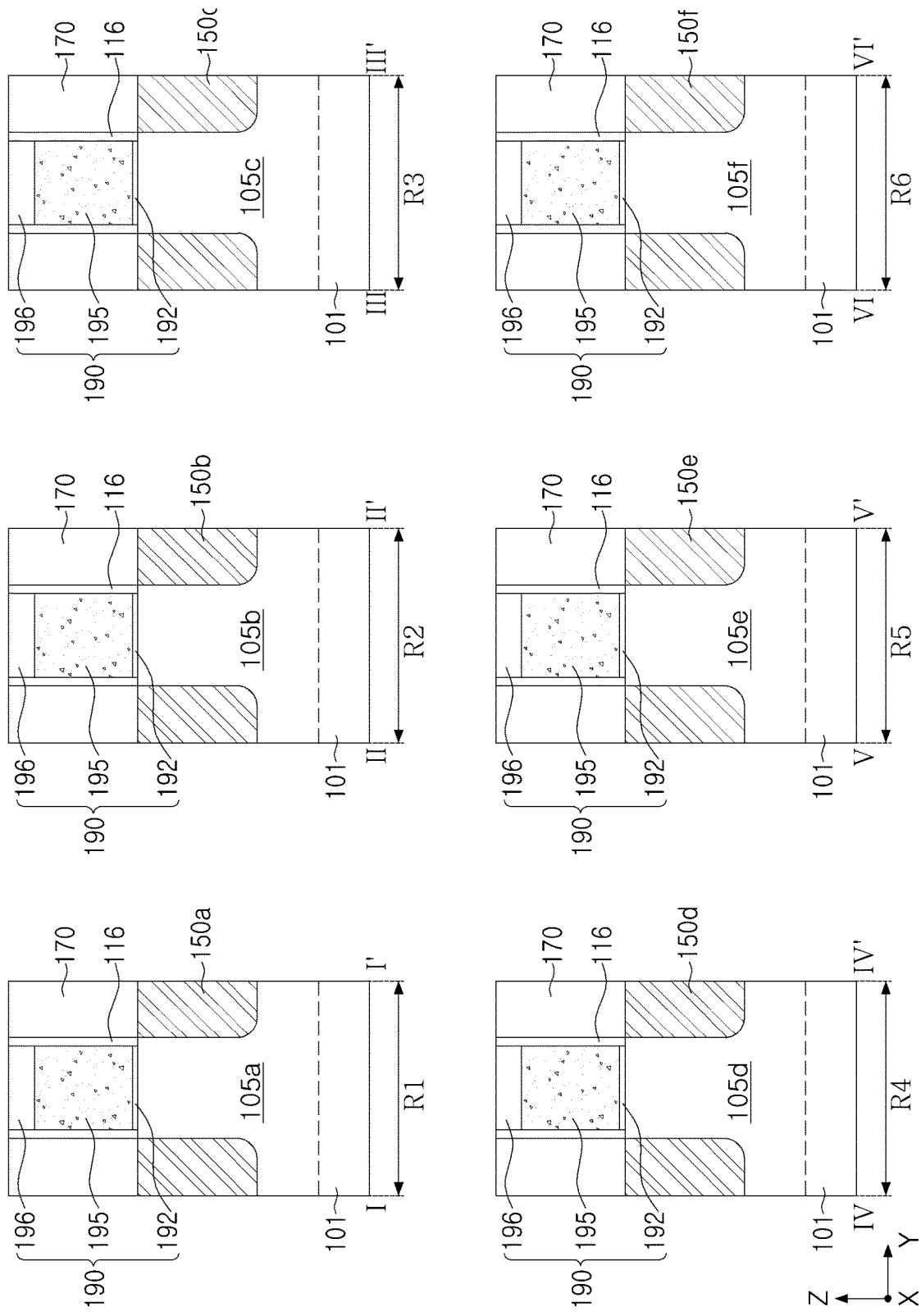

SEMICONDUCTOR DEVICES AND METHODS OF MANUFACTURING THE SAME

CROSS-REFERENCE TO RELATED APPLICATION(S)

This application claims the benefit of priority to Korean Patent Application No. 10-2020-0045923 filed on Apr. 16, 2020 in the Korean Intellectual Property Office, the disclosure of which is incorporated herein by reference in its entirety.

BACKGROUND

The present disclosure relates to semiconductor devices. As the demand for high performance, high speed, and multi-functionality in semiconductor devices has increased, the degree of integration of semiconductor devices has increased. With the trend for high-density semiconductor devices, transistors in semiconductor devices are increasingly scaled down and there is ongoing research into methods of forming transistors having reduced sizes. In order to address limitations of operating characteristics caused by a decrease in sizes of planar metal oxide semiconductor FETs (MOSFETs), various efforts have been made to develop semiconductor devices including FinFETs with a channel having a 3-dimensional structure.

SUMMARY

Example embodiments provide a semiconductor device having improved electrical characteristics and a method of manufacturing the same.

According to an example embodiment, a semiconductor device includes a substrate having first to third regions, a first transistor on the first region and including a first gate dielectric layer, a first gate electrode layer on the first gate dielectric layer, and first source/drain regions on the substrate on opposite sides, adjacent to the first gate electrode layer, a second transistor on the second region and including a second gate dielectric layer, a second gate electrode layer on the second gate dielectric layer, and second source/drain regions on the substrate on opposite sides, adjacent to the second gate electrode layer, and a third transistor on the third regions and including a third gate dielectric layer, a third gate electrode layer on the third gate dielectric layer, and third source/drain regions on the substrate on opposite sides, adjacent to the third gate electrode layer. Each of the first and second gate electrode layers includes a first conductive layer, a first upper conductive layer on the first conductive layer, and a first internal conductive layer on the first upper conductive layer. The third gate electrode layer includes a second conductive layer, a second upper conductive layer on the second conductive layer, and a second internal conductive layer on the second upper conductive layer. The first and second conductive layers each include first and second layers, the first conductive layer further includes third and fourth layers, the first and second conductive layers include TiN, at least one of the first to fourth layers includes TiON, and the first to third transistors are MOSFETs having the same channel conductivity type.

According to an example embodiment, a semiconductor device includes a substrate having first and second regions, a first gate electrode layer on the first region and including a first conductive layer, including a first plurality of layers, and the first gate electrode layer including a first upper conductive layer on the first conductive layer, and a second gate electrode layer on the second region and including a second conductive layer, including a second plurality of layers, and the second gate electrode layer including a second upper conductive layer on the second conductive layer. At least one of the first plurality of layers includes TiON, a first transistor including the first gate electrode layer and a second transistor including the second gate electrode layer are MOSFETs having the same channel conductivity type, and a threshold voltage of the first transistor is smaller than a threshold voltage of the second transistor.

According to an example embodiment, a semiconductor device includes a substrate having first to third regions, a first gate structure on the first region and including a first gate dielectric layer, a first conductive layer on the first gate dielectric layer, and a first upper conductive layer on the first conductive layer, a second gate structure on the second region and including a second gate dielectric layer, a second conductive layer on the second gate dielectric layer, and a second upper conductive layer on the second conductive layer, and a third gate structure on the third region and including a third gate dielectric layer, a third conductive layer on the third gate dielectric layer, and a third upper conductive layer on the third conductive layer. Each of the first to third conductive layers includes one or a plurality of first layers including TiN, and the first and second conductive layers further include one or a plurality of second layers including TiON.

According to an example embodiment, a method of manufacturing a semiconductor device includes forming active fins, sacrificial gate structures, and source/drain regions in first to sixth regions of a substrate, removing the sacrificial gate structure to form openings, forming a gate dielectric layer in the openings, forming a first layer in the first to sixth regions, removing the first layer in the third to sixth regions, forming a second layer in the first to sixth regions, removing the second layer in the fourth to sixth regions, forming a third layer in the first to sixth regions, removing the third layer in the fifth and sixth regions, and forming a fourth layer in the first to sixth regions. Among the first to fourth layers, one or a plurality of layers is formed of TiON formed by oxidizing TiN, and others of the first to fourth layers are formed of TiN. A threshold voltage of a transistor, including the TiON, is smaller than a threshold voltage of a transistor, not including the TiON.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, example embodiments will be described with reference to the accompanying drawings.

Figure 1:
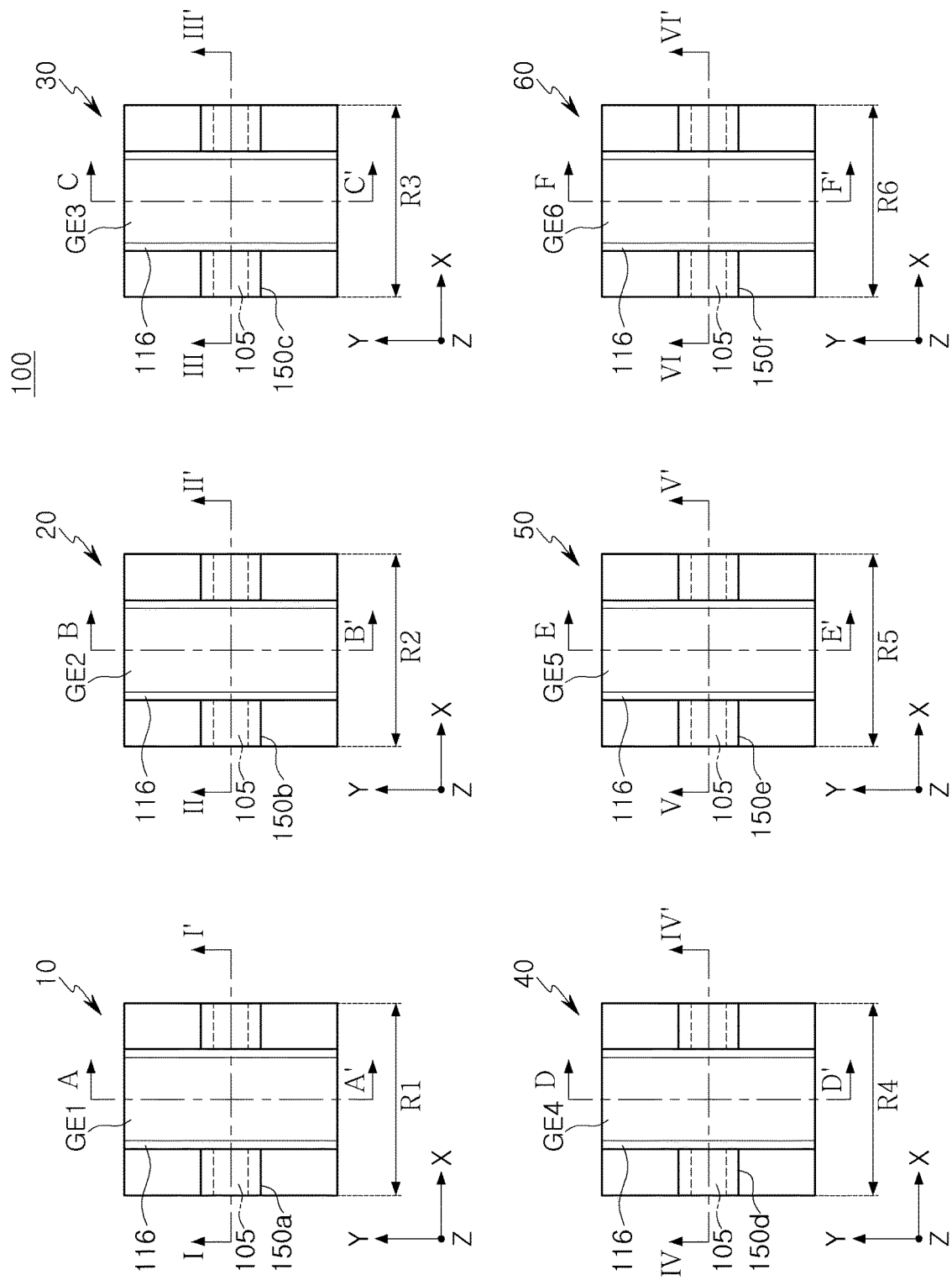
FIG. 1 is a plan view of a plurality of transistors of a semiconductor device according to example embodiments.
Figure 2A:
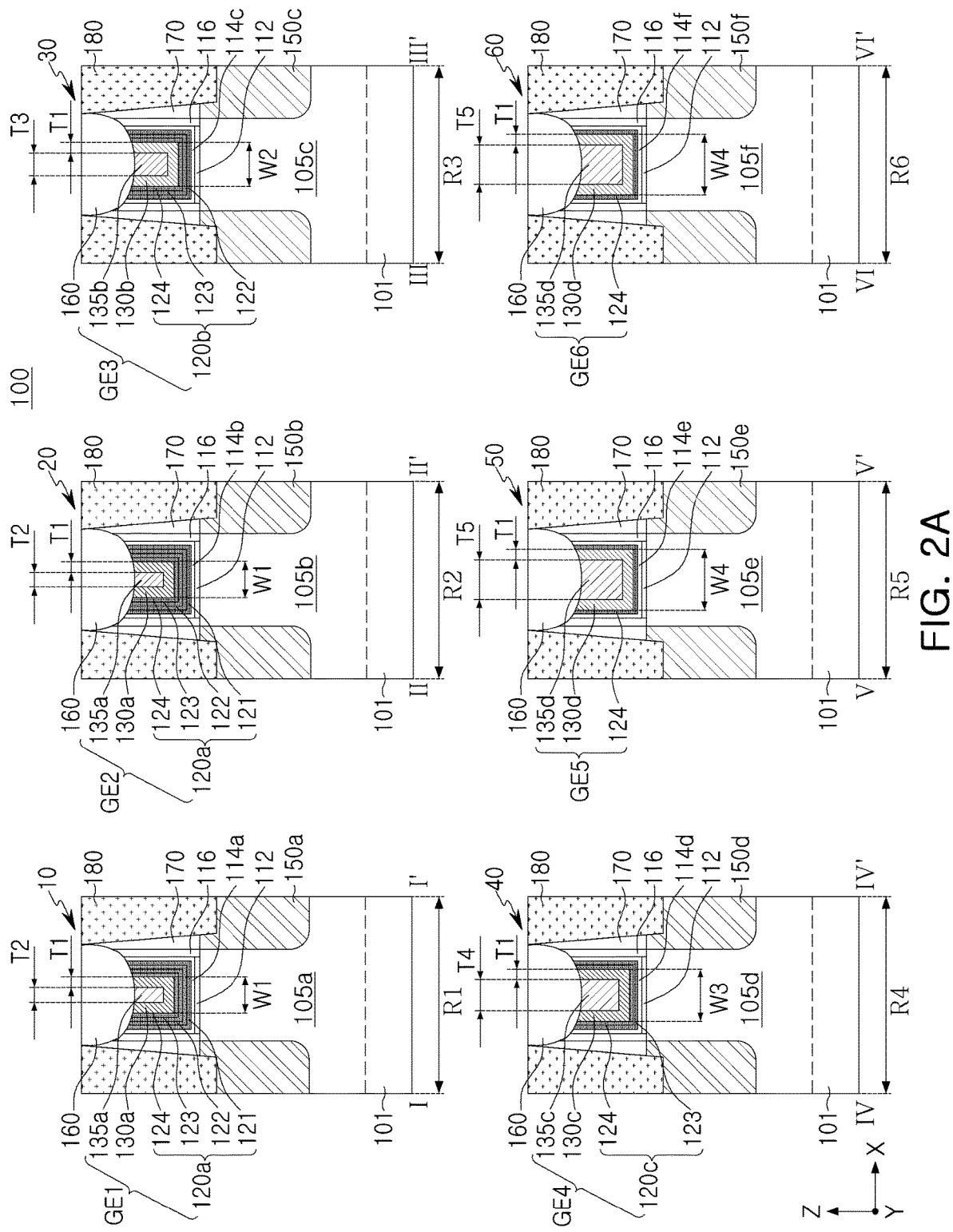
FIG. 2A illustrates cross-sectional views of the semiconductor device in FIG. 1, taken along lines I-I', IV-IV', V-V', and VI-VI', respectively.
Figure 2B:
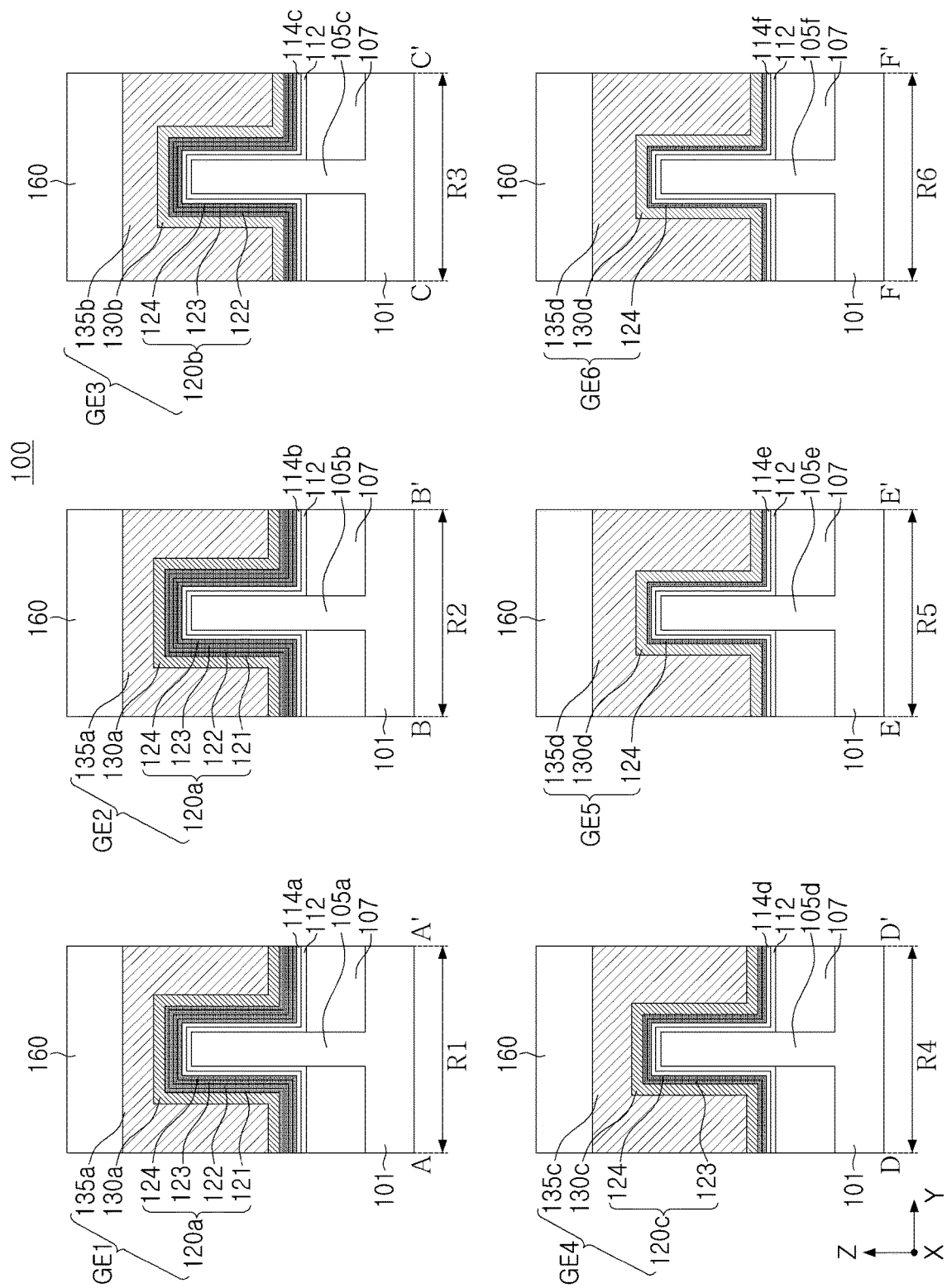
FIG. 2B illustrates cross-sectional views of the semiconductor device in FIG. 1, taken along lines A-A', B-B', C-C', D-D', E-E', and F-F', respectively.

FIG. 1 is a plan view of a plurality of transistors of a semiconductor device according to example embodiments. FIG. 2A illustrates cross-sectional views of the semiconductor device in FIG. 1, taken along lines I-I', IV-IV', V-V', and VI-VI', respectively. FIG. 2B illustrates cross-sectional views of the semiconductor device in FIG. 1, taken along lines A-A', B-B', C-C', D-D', E-E', and F-F', respectively.

Referring to FIGS. 1 to 2B, a semiconductor device 100 may include a substrate 101 having first to sixth regions R1, R2, R3, R4, R5, and R6, and active fins 105a, 105b, 105c, 105d, 105e, and 105f, source/drain regions 150a, 150b, 150c, 150d, 150e, and 150f, interface layers 112, gate dielectric layers 114a, 114b, 114c, 114d, 114e, and 114f, gate spacer layers 116, and first to sixth gate electrode layers GE1, GE2, GE3, GE4, GE5, and GE6. The semiconductor device 100 may further include an isolation region 107, a gate capping layer 160, an interlayer insulating layer 170, and a contact structure 180. The gate dielectric layers 114a to 114f, the gate spacer layers 116, the first to sixth gate electrode layers GE1 to GE6, and the gate capping layer 160 may be collectively referred to as a gate structure.

The semiconductor device 100 may include FinFET elements, transistors in which active fins 105a to 105f have a fin structure. The FinFET elements may include first to sixth transistors 10, 20, 30, 40, 50, and 60. For example, the first to third transistors 10, 20, and 30 may be p-type MOS field effect transistors (MOSFETs), and the fourth to sixth transistors 40, 50, and 60 may be n-type MOSFETs. The first to sixth transistors 10, 20, 30, 40, 50, and 60 may be driven by different threshold voltages and may constitute the same circuit or different circuits in the semiconductor device 100.

The first transistor 10 may include a first active fin 105a, a first gate dielectric layer 114a, first source/drain regions 150a, and a first gate electrode layer GE1. The second transistor 20 may include a second active fin 105b, a second gate dielectric layer 114b, second source/drain regions 150b, and a second gate electrode layer GE2. The third transistor 30 may include a third active fin 105c, a third gate dielectric layer 114c, third source/drain regions 150c, and a third gate electrode layer GE3. The fourth transistor 40 may include a fourth active fin 105d, a fourth gate dielectric layer 114d, fourth source/drain regions 150d, and a fourth gate electrode layer GE4. The fifth transistor 50 may include a fifth active fin 105e, a fifth gate dielectric layer 114e, fifth source/drain regions 150e, and a fifth gate electrode layer GE5. The sixth transistor 60 may include a sixth active fin 105f, a sixth gate dielectric layer 114f, sixth source/drain regions 150f, and a sixth gate electrode layer GE6.

The substrate 101 may have first to sixth regions R1 to R6 different from each other. The first to sixth regions R1-R6 may be regions in which first to sixth transistors 10, 20, 30, 40, 50, and 60 are disposed, respectively. The first to sixth regions R1 to R6 may be disposed to be spaced apart from each other or to be adjacent to each other in the semiconductor device 100.

The substrate 101 may have an upper surface extending in an X direction and a Y direction. The substrate 101 may include a semiconductor material such as a group IV semiconductor, a group III-V compound semiconductor, or a group II-VI oxide semiconductor. For example, the group IV semiconductor may include silicon (Si), germanium (Ge), or silicon-germanium (SiGe). The substrate 101 may be provided as a bulk wafer, an epitaxial layer, a silicon-on-insulator (SOI) layer, a semiconductor-on-insulator (SeOI) layer, or the like.

The isolation regions 107 may define the active fins 105a to 105f in the substrate 101, as illustrated in FIG. 2B. The isolation regions 107 may be formed by, for example, a shallow trench isolation (STI) process. According to example embodiments, the isolation regions 107 may include regions extending deeper downwardly of the substrate 101 between adjacent active fins 105a to 105f. The isolation regions 107 may include an insulating material. Each of the isolation regions 107 may include, for example, an oxide, a nitride, or a combination thereof.

The active fins 105a to 105f are defined by the isolation regions 107 in the substrate 101 and may be disposed to extend in one direction, for example, the X direction. The active fins 105a to 105f may have a shape of a line or bar protruding from the substrate 101 between the isolation regions 107. In FIG. 1, the active fins 105a to 105f are illustrated as being disposed one by one in the first to sixth regions R1 to R6, respectively. However, the arrangement and the number of the active fins 105a to 105f are not limited thereto. For example, two or three or more active fins 105a to 105f may be disposed in each of the first to sixth regions R1 to R6.

Among the active fins 105a to 105f, certain active fins may be recessed on opposite sides of the first to sixth gate electrode layers GE1 to GE6. Source/drain regions 150a to 150f may be disposed on the recessed active fins 105a to 105f. Accordingly, the active fins 105a to 105f may have a relatively great height below the first to sixth gate electrode layers GE1 to GE6. In example embodiments, the active fins 105a to 105f may include impurities. For example, the first to third active fins 105a, 105b, and 105c may include n-type impurities, and the fourth to sixth active fins 105d, 105e, and 105f may include p-type impurities.

The interface layers 112 may be disposed between the active fins 105a to 105f and the gate dielectric layers 114a to 114E The interface layers 112 may include a dielectric material, for example, a silicon oxide, a silicon oxynitride, or combinations thereof.

The gate dielectric layers 114a to 114f may be disposed between the active fins 105a to 105f and the first to sixth gate electrode layers GE1 to GE6. The gate dielectric layers 114a to 114f may be disposed on (e.g., to cover) lower surfaces and opposite side surfaces of the first to sixth gate electrode layers GE1 to GE6.

The gate dielectric layers 114a to 114f may include an oxide, a nitride, or a high-k dielectric material. The high-k dielectric material may refer to a dielectric material having a higher dielectric constant than silicon oxide (Sift). The high-k dielectric materials include, for example, an aluminum oxide ($Al_2O_3$), a tantalum oxide ($Ta_2O_3$), a titanium oxide (TiO$_2$), an yttrium oxide (Y$_2$O$_3$), a zirconium oxide (ZrO$_2$), a zirconium silicon oxide (ZrSi$_x$O$_y$), a hafnium oxide (LaHf$_x$O$_y$), a hafnium silicon oxide (HfSi$_x$O$_y$), a lanthanum oxide (La$_2$O$_3$), a lanthanum aluminum oxide (LaAl$_x$O$_y$), a lanthanum hafnium oxide (LaHf$_x$O$_y$), a hafnium aluminum oxide (HfAl$_x$O$_y$), a praseodymium oxide (Pr$_2$O$_3$), or combinations thereof. The gate dielectric layers 114a to 114f may include a common (i.e., the same) material, and the second, fourth, and sixth gate dielectric layers 114b, 114d, and 114f may further include an element serving to increase or decrease a threshold voltage of a transistor, more than the first, third, and fifth gate dielectric layers 114a, 114c, and 114e. For example, the second, fourth, and sixth gate dielectric layers 114b, 114d, and 114f may further include a rare earth element, such as lanthanum (La), gadolinium (Gd), ruthenium (Ru), yttrium (Y), or scandium (Sc), that may be absent from (or present at a smaller concentration in) the first, third, and fifth gate dielectric layers 114a, 114c, and 114e. Such elements may form, for example, an electric dipole to change a threshold voltage of a transistor.

The gate spacer layers 116 may be disposed on opposite side surfaces of the first to sixth gate electrode layers GE1 to GE6. The gate spacer layers 116 may insulate the source/drain regions 150a to 150f and the first to sixth gate electrode layers GE1 to GE6. According to example embodiments, the gate spacer layers 116 may have a multilayer structure. The gate spacer layers 116 may include an oxide, a nitride, or an oxynitride.

The first to sixth gate electrode layers GE1 to GE6 may be disposed to extend in one direction, for example, in the y direction while intersecting the active fins 105a to 105f above the active fins 105a to 105f. Channel regions of the first to sixth transistors 10, 20, 30, 40, 50, and 60 may be formed in the active fins 105a to 105f intersecting the first to sixth gate electrode layers GE1 to GE6.

In the first to sixth regions R1 to R6, the first to sixth gate electrode layers GE1 to GE6 may have substantially the same length or similar lengths in a channel direction, for example, the X direction. In the first to sixth regions R1 to R6, the first to sixth gate electrode layers GE1 to GE6 may have substantially the same height or similar heights in a vertical direction, for example, a Z direction. The length and/or the height of the first to sixth gate electrode layers GE1 to GE6 are not limited to those illustrated in the drawings, and may vary according to example embodiments. For example, at least one of the first to sixth gate electrode layers GE1 to GE6 may have a relatively greater length in the X direction than the other gate electrode layers.

Each of the first gate electrode layer GE1 and the second gate electrode layer GE2 may include a first conductive layer 120a including first to fourth layers 121, 122, 123, and 124, a first upper conductive layer 130a on the first conductive layer 120a, and a first internal conductive layer 135a on the first upper conductive layer 130a.

The third gate electrode layer GE3 may include a second conductive layer 120b including second to fourth layers 122, 123, and 124, a second upper conductive layer 130b on the second conductive layer 120b, and a second internal conductive layer 135b on the second upper conductive layer 130b.

The fourth gate electrode layer GE4 may include a third conductive layer 120c including third and fourth layers 123 and 124, a third upper conductive layer 130c on the third conductive layer 120c, and a third internal conductive layer 135c on the third upper conductive layer 130c.

Each of the fifth gate electrode layer GE5 and the sixth gate electrode layer GE6 may include a fourth layer 124, a fourth upper conductive layer 130d on the fourth layer 124, and a fourth internal conductive layer 135d on the fourth upper conductive layer 130d.

A relative thickness of each of the layers, constituting the first to sixth gate electrode layers GE1 to GE6, is not limited to that illustrated in the drawings, and may vary according to example embodiments. The number of the layers, constituting the first to sixth gate electrode layers GE1 to GE6, is also not limited to that illustrated in the drawing, and may vary according to example embodiments. For example, the first gate electrode layer GE1 may include a first conductive layer 120a including a first plurality of layers, and the second gate electrode layer GE2 may include a second conductive layer 120b including a second plurality of layers. The first plurality of layers and the second plurality of layers may have either equal or different numbers of layers.

In each of the first and second gate electrode layers GE1 and GE2, the first to fourth layers 121, 122, 123, and 124 of the first conductive layer 120a have substantially the same thickness. In the first transistor 10, the first to fourth layers 121, 122, 123, and 124 may be conformally disposed on the first gate dielectric layer 114a and may be sequentially stacked. In the second transistor 20, the first to fourth layers 121, 122, 123, and 124 may be conformally disposed on the second gate dielectric layer 114b and may be sequentially stacked. Each of the first to fourth layers 121, 122, 123, and 124 may have a U shape or a U-like shape. The first to fourth layers 121, 122, 123, and 124 may incompletely fill a space defined by the first and second gate dielectric layers 114a and 114b and the gate capping layer 160. Each of the first to fourth layers 121, 122, 123, and 124 may have a thickness within a range of about 1 nanometer (nm) to about 2 nm. Boundaries between the first to fourth layers 121, 122, 123, and 124 may be apparent or may not apparent.

Each of the first to fourth layers 121, 122, 123, and 124 may include titanium nitride (TiN), tantalum nitride (TaN), titanium oxynitride (TiON), titanium silicon nitride (TiSiN), tungsten (W), tungsten carbonitride (WCN), or combinations thereof. At least one of the first to fourth layers 121, 122, 123, or 124 may include TiON.

As an example, the first layer 121 may include TiON, and each of the second to fourth layers 122, 123, and 124 may include TiN.

As another example, each of the first and second layers 121 and 122 may include TiON, and each of the third and fourth layers 123 and 124 may include TiN.

As another example, each of the first to third layers 121, 122, and 123 may include TiON, and the fourth layer 124 may include TiN.

As another example, the second layer 122 may include TiON, and each of the first, third and fourth layers 121, 123, 124 may include TiN.

A combination of a layer including TiON and a layer including TiN, among the first to fourth layers 121, 122, 123, and 124, may vary according to example embodiments. In the gate electrode layer, a threshold voltage of a transistor may be changed by a combination of materials forming the first to fourth layers 121, 122, 123, and 124.

In one embodiment in which the first conductive layer 120a includes TiN, at least one of the first to fourth layers 121, 122, 123, and 124 may have a higher concentration of oxygen elements than other adjacent layers. Alternatively, at least one of the first to fourth layers 121, 122, 123, or 124 may have a smaller concentration of oxygen than other adjacent layers. The first layer 121 may be disposed in a lowest portion of the first conductive layer 120a.

In the third gate electrode layer GE3 of the third transistor 30, the second to fourth layers 122, 123, and 124 of the second conductive layer 120b may be conformally disposed on the third gate dielectric layer 114c and may be sequentially stacked. The descriptions of the first conductive layer 120a except the description of the first layer 121, may be equally applied to the second to fourth layers 122, 123, and 124 of the second conductive layer 120b.

In the fourth gate electrode layer GE4 of the fourth transistor 40, the third and fourth layers 123 and 124 of the third conductive layer 120c may be conformally disposed on the fourth gate dielectric layer 114d and may be sequentially stacked. The descriptions of the first conductive layer 120a except the descriptions of the first and second layers 121 and 122, may be equally applied to the third and fourth layers 123 and 124 of the third conductive layer 120c.

Each of the fifth and sixth gate electrode layers GE5 and GE6 of the fifth and sixth transistors 50 and 60 may include a fourth conductive layer. The fourth conductive layer may include a fourth layer 124. The fourth layer 124 may be conformally disposed on the fifth gate dielectric layer 114e in the fifth transistor 50. The fourth layer 124 may be conformally disposed on the sixth gate dielectric layer 114f in the sixth transistor 60. The descriptions of the first conductive layer 120a except the descriptions of the first to third layers 121, 122, and 123, may be equally applied to the fourth layer 124.

In an example embodiment, a thickness of the first conductive layer 120a may be greater than a thickness of the second conductive layer 120b. The thickness of the first conductive layer 120a may be greater than a thickness of the third conductive layer 120c. The thickness of the first conductive layer 120a may be greater than a thickness of the fourth conductive layer including the fourth layer 124. The thickness of the second conductive layer 120b may be greater than the thickness of the third conductive layer 120c. The thickness of the second conductive layer 120b may be greater than the thickness of the fourth conductive layer including the fourth layer 124. The thickness of the third conductive layer 120c may be greater than the thickness of the fourth conductive layer including the fourth layer 124.

Each of the first and second gate electrode layers GE1 and GE2 of the first and second transistors 10 and 20 may include a first upper conductive layer 130a. The first upper conductive layer 130a may be conformally disposed on the first conductive layer 120a in the first and second transistors 10 and 20. The first upper conductive layer 130a has a U shape or a U-like shape, and may incompletely fill a space defined by the first conductive layer 120a and the gate capping layer 160. The first upper conductive layer 130a may have a first width W1 in the X direction. The first width W1 may refer to a distance between external (i.e., exterior) sidewall surfaces of the first upper conductive layer 130a in the X direction. The first upper conductive layer 130a may be formed to have a first thickness T1, a substantially constant thickness. In an example embodiment, the first thickness T1 may range from about 4 nm to about 6 nm. The first thickness T1 may be described as a "width."

The first upper conductive layer 130a may include an alloy including aluminum (Al), a conductive metal carbide including Al, a conductive metal nitride including Al, or combinations thereof and may include titanium aluminide (TiAl), titanium aluminum carbide (TiAlC), titanium aluminum nitride (TiAlN), or combinations thereof. The first upper conductive layer 130a may have a work function smaller than a work function of the first conductive layer 120a, but the present disclosure is not limited thereto.

The first internal conductive layer 135a may be disposed in each of the first and second gate electrode layers GE1 and GE2 of the first and second transistors 10 and 20. The first internal conductive layer 135a may have a non-U shape, such as a pillar (e.g., rectangular) shape or a pillar-like shape, and may fill a space defined by the first upper conductive layer 130a and the gate capping layer 160. The first internal conductive layer 135a may have a second thickness T2 between internal (i.e., interior) sidewall surfaces of the first upper metal layer 130a in the X direction. The second thickness T2 may be described as "width." The second thickness T2 may be substantially the same as or greater than the first thickness T1. However, relative sizes of the second thickness T2 and the first thickness T1 may vary according to a line width of the gate structure and/or a thickness of each of the layers constituting the gate structure.

The first internal conductive layer 135a may include a material different from a material of the first upper conductive layer 130a. The first internal conductive layer 135a may include, for example, TiN, TaN, W, WCN, or combinations thereof. However, the first internal conductive layer 135a is not necessarily formed of a metal material and may be formed of a semiconductor material such as polysilicon according to example embodiments.

The second upper conductive layer 130b may be disposed in the third gate electrode layer GE3 of the third transistor 30. The second upper conductive layer 130b may be conformally disposed on the second conductive layer 120b in the third transistor 30. The above description of the first upper conductive layer 130a may be equally applied to the second upper conductive layer 130b. However, the second upper conductive layer 130b may have a second width W2 greater than the first width W1 of the first upper conductive layer 130a in the X direction. The second upper conductive layer 130b may have substantially the same thickness as the first thickness T1 of the first upper conductive layer 130a.

The second internal conductive layer 135b may be disposed in the third gate electrode layer GE3 of the third transistor 30. The second internal conductive layer 135b may have a pillar shape or a pillar-like shape, and may fill a space defined by the second upper conductive layer 130b and the gate capping layer 160. The above description of the first internal conductive layer 135a may be equally applied to the second internal conductive layer 135b. However, the second internal conductive layer 135b may have a third thickness T3 greater than the second thickness T2 of the first internal conductive layer 135a between the second upper metal layers 130b in the X direction. The third thickness T3 may be described as "width."

The third upper conductive layer 130c may be disposed in the fourth gate electrode layer GE4 of the fourth transistor 40. The third upper conductive layer 130c may be conformally disposed on the third conductive layer 120c in the fourth transistor 40. The above description of the first upper conductive layer 130a may be equally applied to the third upper conductive layer 130c. However, the third upper conductive layer 130c may have a third width W3, greater than the first width W1, of the first upper conductive layer 130a in the X direction. The third width W3 may be greater than the second width W2.

The third internal conductive layer 135c may be disposed in the fourth gate electrode layer GE4 of the fourth transistor 40. The third internal conductive layer 135c may have a pillar shape or a pillar-like shape, and may fill a space defined by the third upper conductive layer 130c and the gate capping layer 160. The above description of the first internal conductive layer 135a may be equally applied to the third internal conductive layer 135c. However, the third internal conductive layer 135c has a fourth thickness T4 greater than the second thickness T2 of the first internal conductive layer 135a between the third upper metal layers 130c in the X direction. The fourth thickness T4 may be greater than the third thickness T3. The fourth thickness T4 may be described as "width."

The fourth upper conductive layer 130d may be disposed in each of the fifth and sixth gate electrode layers GE5 and GE6 of the fifth and sixth transistors 50 and 60. The fourth upper conductive layer 130d may be conformally disposed on the fourth layer 124 in the fifth and sixth transistors 50 and 60. The above description of the first upper conductive layer 130a may be equally applied to the fourth upper conductive layer 130d. However, the fourth upper conductive layer 130d may have a fourth width W4 larger than the first width W1 of the first upper conductive layer 130a in the X direction. The fourth width W4 may be greater than the second width W2 and the third width W3.

The fourth internal conductive layer 135d may be disposed in each of the fifth and sixth gate electrode layers GE5 and GE6 of the fifth and sixth transistors 50 and 60. The fourth internal conductive layer 135d may have a pillar shape or a pillar-like shape, and may fill a space defined by the fourth upper conductive layer 130d and the gate capping layer 160. The above description of the first internal conductive layer 135a may be equally applied to the fourth internal conductive layer 135d. However, the fourth internal conductive layer 135d may have a fifth thickness T5 greater than the second thickness T2 of the first internal conductive layer 130a between the fourth upper metal layers 130d in the X direction. The fifth thickness T5 may be greater than the third thickness T3 and the fourth thickness T4. The fifth thickness T5 may be described as "width."

The first to third transistors 10, 20, and 30 may be MOSFETs having the same channel conductivity type but may have different threshold voltages. For example, the first to third transistors 10, 20, and 30 may be p-channel MOSFETs. The first transistor 10 may have a smaller threshold voltage than the second transistor 20. Also, the second transistor 20 may have a smaller threshold voltage than the third transistor 30.

The fourth to sixth transistors 40, 50, and 60 may be MOSFETs having the same channel conductivity type but may have different threshold voltages. For example, the fourth to sixth transistors 40, 50, and 60 may be n-channel MOSFETs. The fourth transistor 40 may have a higher threshold voltage than the fifth transistor 50. Also, the fifth transistor 50 may have a higher threshold voltage than the sixth transistor 60.

In the present disclosure, the magnitude of the threshold voltage may be compared as an absolute value. A difference between threshold voltages of the first and second transistors 10 and 20 may be caused by a difference between the first gate dielectric layer 114a and the second gate dielectric layer 114b. Since at least one of the first to fourth layers 121, 122, 123, and 124 includes TiON, the first gate electrode GE1 of each of the first and second transistors 10 and 20 may have a relatively smaller threshold voltage than when at least one of the first to fourth layers 121, 122, 123, or 124 does not include TiON. When a layer including TiON is present in the gate electrode, a transistor having a threshold voltage, decreased by about 10 millivolts (mV) to about 60 mV as compared to the case in which the layer including TiON is not present in the gate electrode, may be provided.

According to an example embodiment, the first to third transistors 10, 20, 30 may be MOSFETs having the same conductivity type, for example, as p-channel MOSFETs, the first layer 121 of each of first and second transistors 10 and 20 may include TiON, the second to fourth layers 122, 123, and 124 of the first and second transistors 10 and 20 may include TiN, and the second to fourth layers 122, 123, and 124 of the third transistor 30 may include TiN. In this case, a threshold voltage of the first transistor 10 may be smaller than a threshold voltage of the second transistor 20, and the threshold voltage of the second transistor 20 may be smaller than a threshold voltage of the third transistor 30.

According to an example embodiment, the first to third transistors 10, 20, and 30 may be MOSFETs having the same conductivity type, for example, p-channel MSOFETs, the first and second layers 121 and 122 of the first and second transistors 10 and 20 and the second layer 122 of the third transistor 30 may include TiON, and the third and fourth layers 123 and 124 of the first to third transistors 10, 20, and 30 may include TiN. In this case, a threshold voltage of the first transistor 10 may be smaller than a threshold voltage of the second transistor 20, and the threshold voltage of the second transistor 20 may be smaller than a threshold voltage of the third transistor 30.

According to an example embodiment, the first to third transistors 10, 20, and 30 may be MOSFETs having the same conductivity type, for example, p-channel MSOFETs, the first to third layers 121, 122, and 123 of the first and second transistors 10 and 20 and the third layer 123 of the third transistor 30 include TiON, and the fourth layer 124 of the first to third transistors 10, 20, and 30 may include TiN. In this case, a threshold voltage of the first transistor 10 may be smaller than a threshold voltage of the second transistor 20, and the threshold voltage of the second transistor 20 may be smaller than a threshold voltage of the third transistor 30.

According to an example embodiment, each of the first to third conductive layers 120a, 120b, and 120c may include one or more layers including TiN. The first and second conductive layers 120a and 120b may include one or more layers including TiON. A thickness of the first conductive layer 120a and a thickness of the second conductive layer 120b may be less than a thickness of the third conductive layer 120c. In the first conductive layer 120a, a single layer or a plurality of layers including TiON may be disposed in a lowermost portion, but the present disclosure is not limited thereto.

In example embodiments, the semiconductor device 100 may not include at least one of the third to sixth transistors 30, 40, 50, or 60. For example, the semiconductor device 100 may include only the first and second transistors 10 and 20, or may include only the first and third transistors 10 and 30. As described above, types of transistors included in the semiconductor device 100 may be variously selected according to threshold voltage ranges required in the semiconductor device 100.

The source/drain regions 150a to 150f may be disposed on the active fins 105a to 105f, respectively, on opposite sides adjacent to the first to sixth gate electrode layers GE1 to GE6. The source/drain regions 150a to 150f may be provided as source regions or drain regions of the first to sixth transistors 10, 20, 30, 40, 50, and 60. According to example embodiments, the source/drain regions 150a to 150f may be connected to or merged with two or more active fins 105a to 105f to form a single source/drain region 150a to 150f.

The source/drain regions 150a to 150f may be a semiconductor layer including silicon (Si), and may include an epitaxial layer. The source/drain regions 150a to 150f may include impurities. For example, the source/drain regions 150a to 150f may include p-type doped silicon-germanium (SiGe). In example embodiments, the source/drain regions 150a to 150f may include a plurality of regions including elements having different concentrations and/or doping elements.

The gate capping layer 160 may be disposed on the first to sixth gate electrode layers GE1 TO GE6 and the gate spacer layers 116. The gate capping layer 160 may be disposed to recess certain upper portions of the first to sixth gate electrode layers GE1 to GE6 and the gate spacer layers 116. A lower surface of the gate capping layer 160 may have a downwardly convex shape, so that upper surfaces of the first to sixth gate electrode layers GE1 to GE6 may also be curved. A maximum width of the gate capping layer 160 may be greater than a width of each of the first to sixth gate electrodes GE1 to GE6 in the X direction. In example embodiments, the gate capping layer 160 may be omitted, and the first to sixth gate electrode layers GE1 to GE6 may upwardly extend longer.

The interlayer insulating layer 170 may be disposed on (e.g., to cover) the isolation regions 107, the source/drain regions 150a to 150f, and the gate capping layer 160. The interlayer insulating layer 170 may include, for example, at least one of an oxide, a nitride, or an oxynitride, and may include a low-k dielectric material.

The contact structure 180 may extend through the interlayer insulating layer 170 to connect (e.g., electrically and/or physically connect) to the source/drain regions 150a to 150f and may apply an electrical signal to the source/drain regions 150a to 150f. The contact structure 180 may have an inclined side surface in which a width of a lower portion is reduced to be narrower than a width of the upper portion according to an aspect ratio, but the present disclosure is not limited thereto. The contact structure 180 may be disposed to be in contact with upper surfaces of the source/drain regions 150a to 150f without recessing the source/drain regions 150a to 150f.

The contact structure 180 may include a conductive layer, a metal-semiconductor compound layer between the conductive layer and the source/drain regions 150a to 150f, and a contact barrier metal layer surrounding the conductive layer. The conductive layer may include W, Co, Ti, alloys thereof, or combinations thereof. The metal-semiconductor compound layer may be a silicide layer, and may include, for example, CoSi, NiSi, or TiSi. The contact barrier metal layer may include TiN, TaN, WN, or combinations thereof.

Figure 3A:
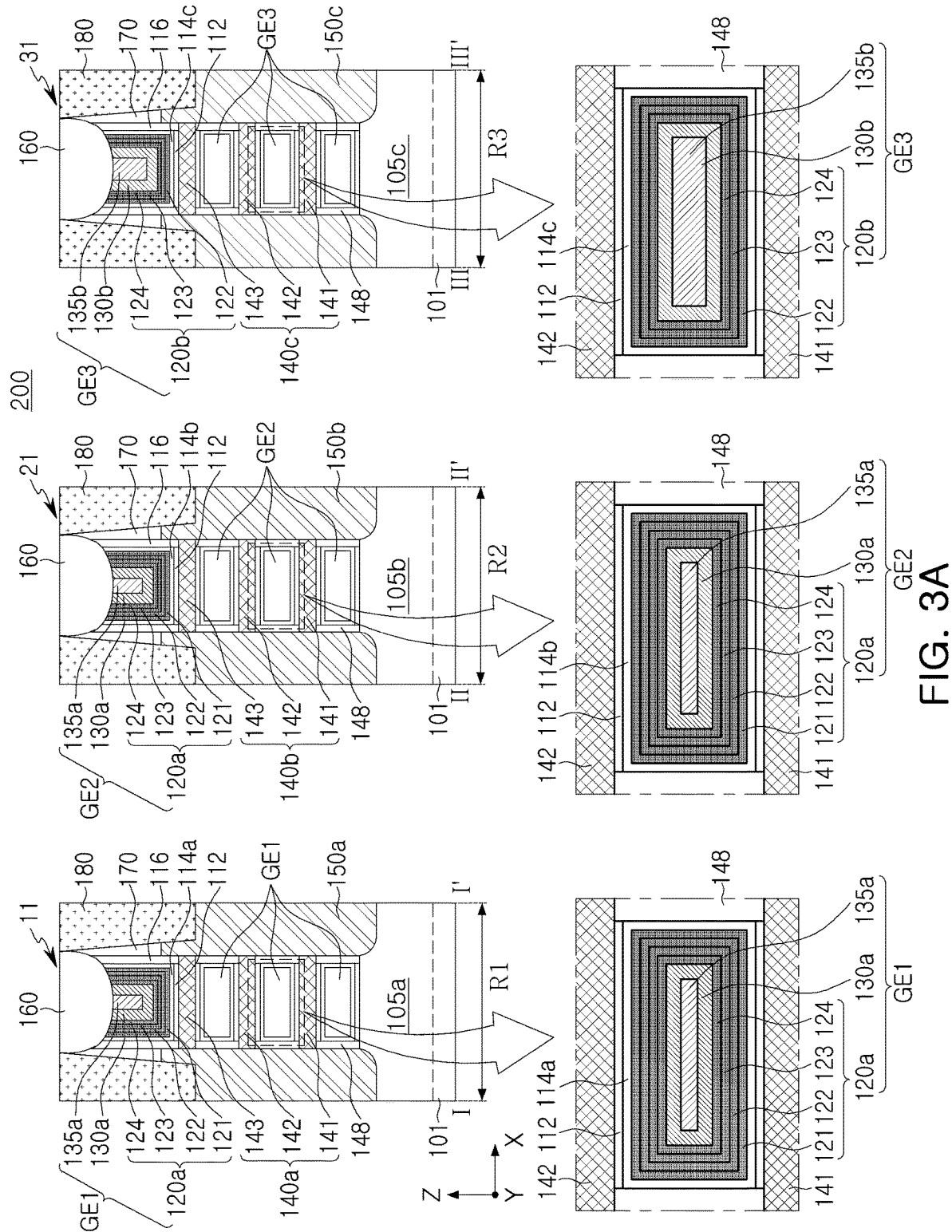
FIG. 3A illustrates cross-sectional views of a semiconductor device according to example embodiments.
Figure 3B:
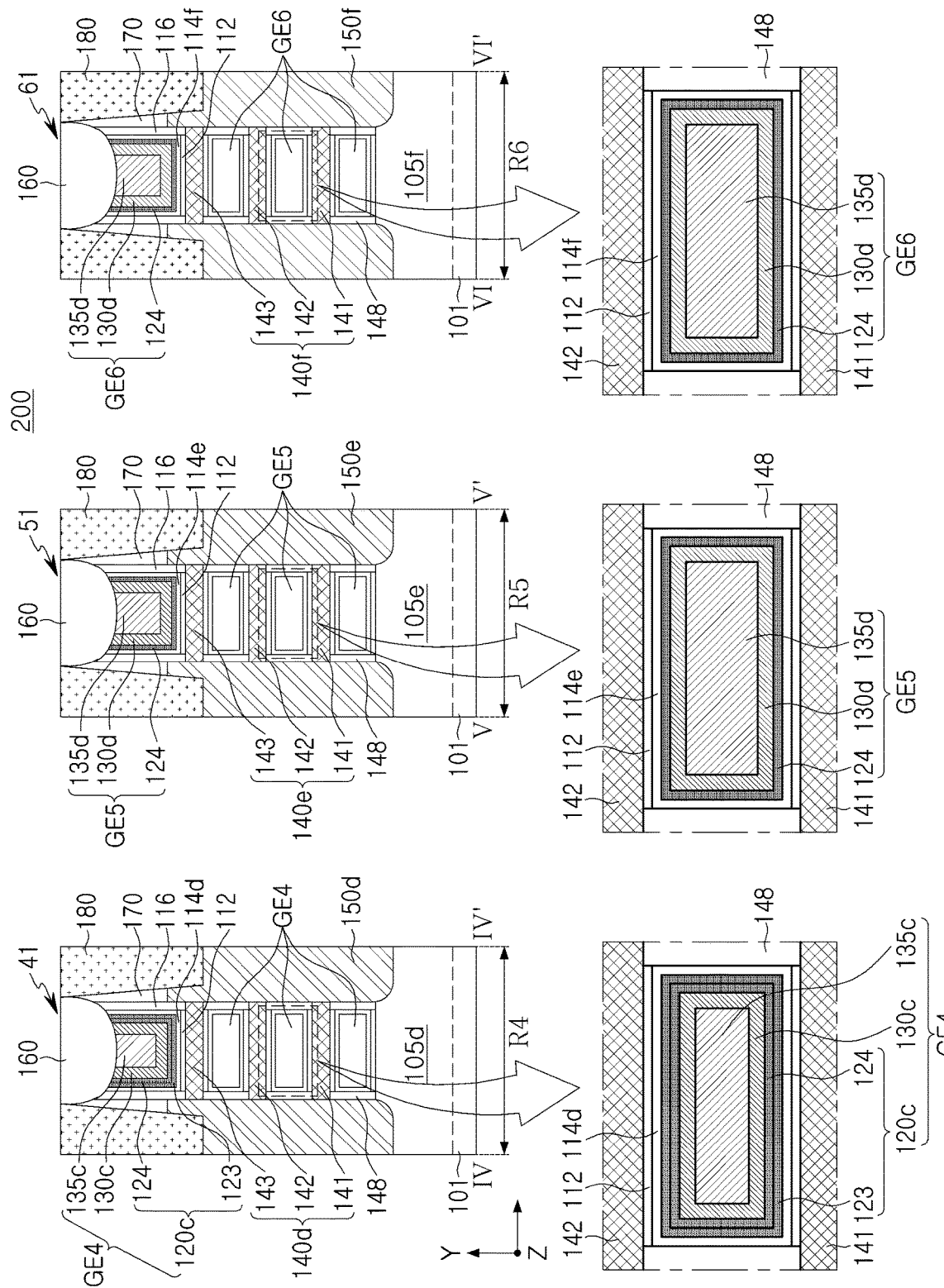
FIG. 3B illustrates cross-sectional views of a semiconductor device according to example embodiments.

FIGS. 3A and 3B are cross-sectional views of a semiconductor device according to example embodiments.

Referring to FIGS. 3A and 3B, a semiconductor device 200 may include a substrate 101 having first to sixth regions R1, R2, R3, R4, R5, and R6, active fins 105a, 105b, 105c, 105d, 105e, and 105f, channel structures 140a to 140f, each including a plurality of channel layers 141, 142, and 143, source/drain regions 150a, 150b, 150c, 150d, 150e, and 150f, interface layers 112, gate dielectric layers 114a, 114b, 114c, 114d, 114e, and 114f, gate spacer layers 116, and first to sixth gate electrode layers GE1, GE2, GE3, GE4, GE5, and GE6. The semiconductor device 100 may further include an isolation region 107, internal spacer layers 148, a gate capping layer 160, an interlayer insulating layer 170, and a contact structure 180. Hereinafter, a description will be given of only a structure different from the semiconductor device 100 in FIGS. 2A and 2B.

In the semiconductor device 200, the active fins 105a to 105f have a fin structure, and the first to sixth gate electrode layers GE1 to GE6 may be disposed between the active fins 105a to 105f and channel structures 140a to 140f, between a plurality of channel layers 141, 142, and 143 of the channel structures 140a to 140f, and above the channel structures 140a to 140f. Therefore, the semiconductor device 200 may include a multi-bridge channel FET (MBCFET™) formed by the channel structures 140a to 140f, the source/drain regions 150a to 150f, and the first to sixth gate electrode layers GE1 to GE6.

The MBCFET™ elements may include first to sixth transistors 11, 21, 31, 41, 51, and 61. For example, the first to third transistors 11, 21, and 31 may be p-type MOS field effect transistors (MOSFETs), and the fourth to sixth transistors 41, 51, and 61 may be n-type MOSFETs. The first to sixth transistors 11 to 61 may be driven by different threshold voltages, and may constitute the same circuit or different circuits in the semiconductor device 200.

The channel structures 140a to 140f may include first to third channel layers 141, 142, and 143, a plurality of channel layers spaced apart from each other on the active fins 105a to 105f in a direction, perpendicular to upper surfaces of the active fins 105a to 105f, for example, a Z direction. The first to third channel layers 141, 142, and 143 may be spaced apart from the upper surfaces of the active fins 105a to 105f while being connected to the source/drain regions 150a to 150f. The first to third channel layers 141, 142, and 143 may be formed of a semiconductor material, and may include at least one of, for example, silicon (Si), silicon-germanium (SiGe), or germanium (Ge). The first to third channel layers 141, 142, and 143 may be formed of, for example, the same material as the substrate 101. The number and shape of the channel layers 141, 142, and 143, constituting one channel structure 140a to 140f, may vary according to example embodiments.

The internal spacer layers 148 may be disposed parallel to the first to sixth gate electrode layers GE1 to GE6 between the channel structures 140a to 140f. The internal spacer layers 148 may be disposed on, for example, opposite sides adjacent to the first to sixth gate electrode layers GE1 to GE6 in the X direction, above a lower surface of each of the first to third channel layers 141, 142, and 143. The internal spacer layers 148 may have external sidewall surfaces, substantially coplanar with external sidewall surfaces of the first to third channel layers 141, 142, and 143. The shape of the internal spacer layers 148 is not limited to that illustrated in the drawings, and a side surface facing the first to sixth gate electrode layers GE1 to GE6 may be convexly rounded inwardly of the first to sixth gate electrodes GE1 to GE6. The internal spacer layers 148 may be formed of an oxide, a nitride, or an oxynitride and, in particular, may include a low-k dielectric material.

The interface layers 112, the gate dielectric layers 114a to 114f, and the first to sixth gate electrode layers GE1 to GE6 may be disposed above the third channel layer 143, and may be disposed between the active fins 105a to 105f and the first channel layer 141, between the first channel layer 141 and the second channel layer 142, and between the second channel layer 142 and the third channel layer 143. The first to sixth gate electrode layers GE1 to GE6 may extend in one direction and be disposed to intersect the active fins 105a to 105f. The interface layers 112 may be disposed on (e.g., to cover) upper and lower surfaces of the channel layers 141, 142, and 143 between the source/drain regions 150a to 150f. Between the source/drain regions 150a to 150f, the gate dielectric layers 114a to 114f may be disposed on (e.g., to cover) internal side surfaces of the internal spacer layers 148 and upper and lower surfaces of the interface layers 112 and to surround the first to fourth layers 121, 122, 123, and 124.

Between the first source/drain regions 150a and between the second source/drain regions 150b, the first to fourth layers 121, 122, 123, and 124 may be disposed to surround the first upper conductive layer 130a and the first upper conductive layer 130a may be disposed to surround the first internal conductive layer 135a. Between the third source/drain regions 150c, the second to fourth layers 122, 123, and 124 may be disposed to surround the second upper conductive layer 130b and the second upper conductive layer 130b may be disposed to surround the second internal conductive layer 135b. Between the fourth source/drain regions 150d, the third and fourth layers 123 and 124 may be disposed to surround the third upper conductive layer 130c and the third upper conductive layer 130c may be disposed to surround the third internal conductive layer 135c. Between the fifth source/drain regions 150e and between the sixth source/drain regions 150f, the fourth layer 124 may be disposed to surround the fourth upper conductive layer 130d and the fourth upper conductive layer 130d may be disposed to surround the fourth internal conductive layer 135d.

Figure 4:
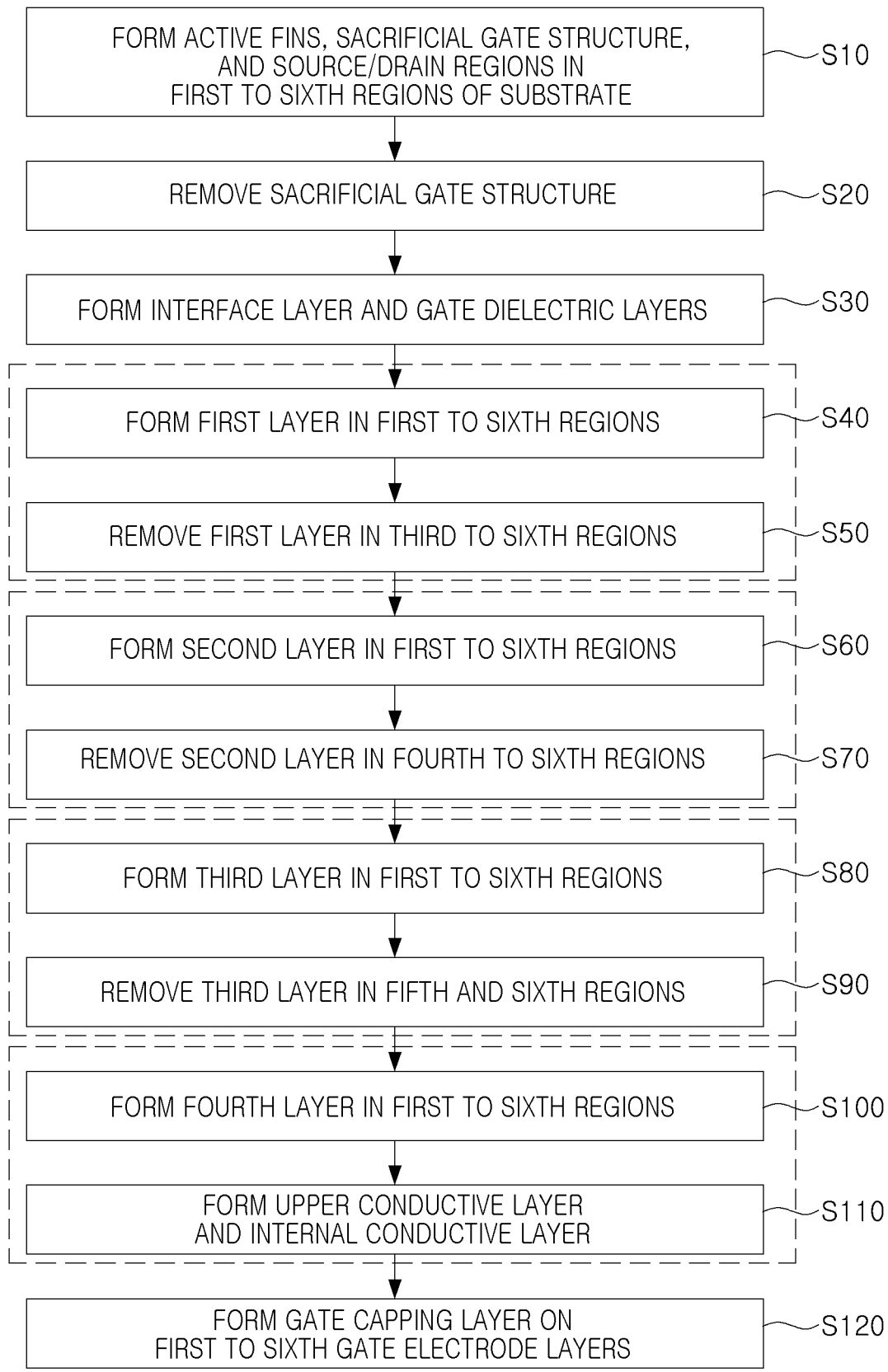
FIG. 4 is a flowchart illustrating a method of manufacturing a semiconductor device according to example embodiments.
Figure 5A:
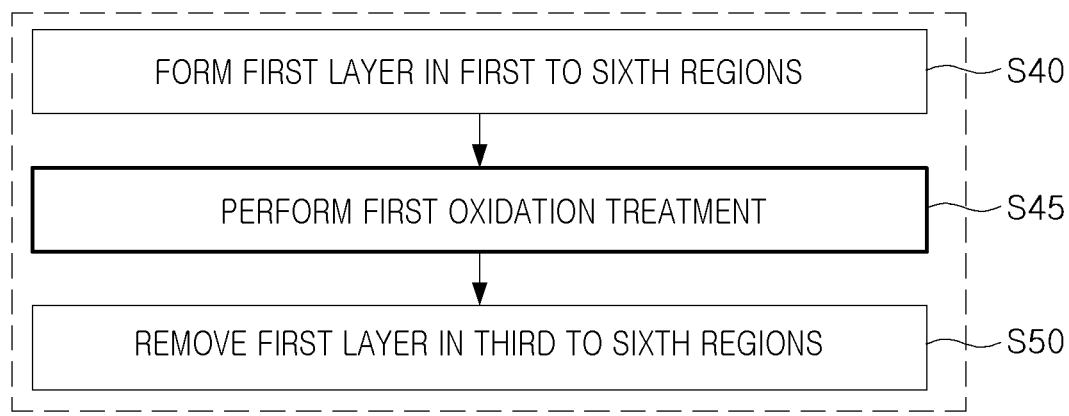
FIGS. 5A to 5D are flowcharts illustrating a method of manufacturing a semiconductor device according to example embodiments.
Figure 5B:
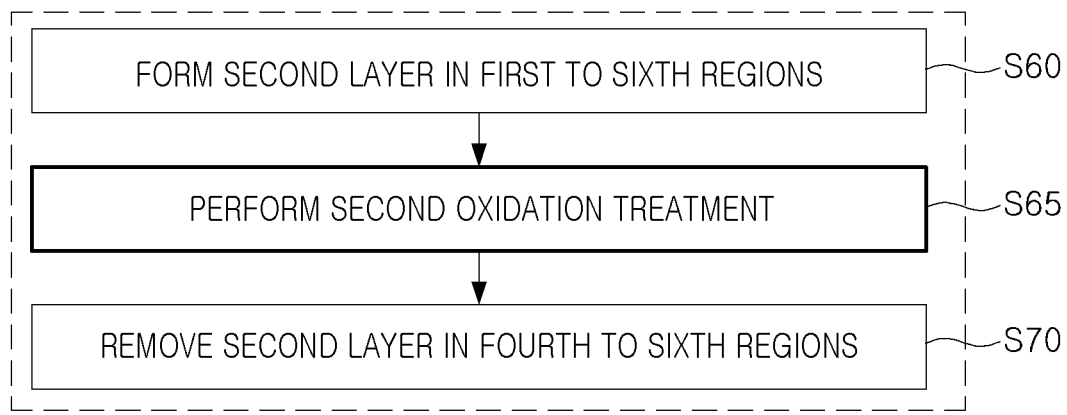
Figure 5C:
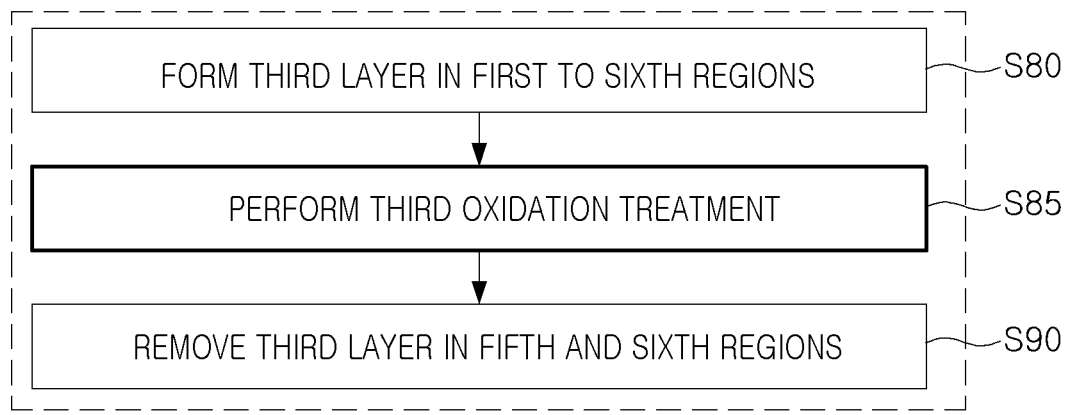
Figure 5D:
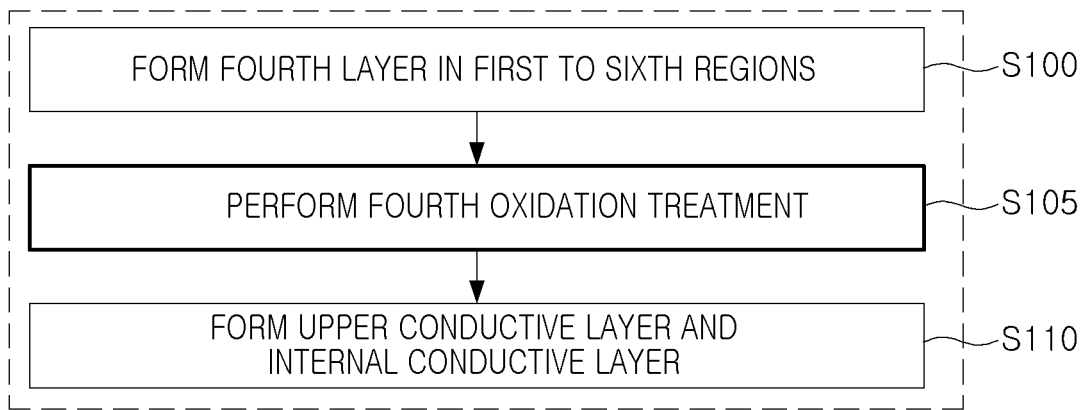

FIG. 4 is a flowchart illustrating a method of manufacturing a semiconductor device according to example embodiments. FIGS. 5A to 5D are flowcharts illustrating a method of manufacturing a semiconductor device according to example embodiments. FIGS. 6A to 6O are process flow diagrams illustrating a method of manufacturing a semiconductor device according to example embodiments. FIGS. 6A to 6O illustrate an example embodiment of a method of manufacturing the semiconductor device in FIGS. 2A and 2B. FIGS. 7A to 7F are partially enlarged cross-sectional views of portions of a semiconductor device, illustrating a method of manufacturing the semiconductor device according to example embodiments.

Referring to FIGS. 4 and 6A, the substrate 101 having first to sixth regions R1 to R6 may be patterned to form active fins 105a to 105f, a sacrificial gate structure 190, and the source/drain regions 150a to 150f (S10). In addition, in operation S10, gate spacer layers 116 and interlayer insulating layer 170 may be formed.

The first to third regions R1, R2, and R3 may be PMOS transistor regions, and the fourth to sixth regions R4, R5, and R6 may be NMOS transistor regions. The substrate 101 may include conductive regions, for example, well structures doped with impurities. The active fins 105a to 105f may be defined by forming isolation regions 107 (see FIG. 2B), and may have a shape protruding from the substrate 101. The active fins 105a to 105f may include impurity regions.

The sacrificial gate structure 190 is disposed in a region, in which the interface layers 112, gate dielectric layers 114a to 114f, and first to sixth gate electrode layers GE1 to GE6 are disposed as illustrated in FIG. 2A, through a subsequent process. The sacrificial gate structure 190 may include a sacrificial gate insulating layer 192, a sacrificial gate electrode layer 195, and a sacrificial gate capping layer 196. The sacrificial gate insulating layer 192 and the sacrificial gate capping layer 196 may be insulating layers and the sacrificial gate electrode layer 195 may be a conductive layer, but the present disclosure is not limited thereto. For example, the sacrificial gate insulating layer 192 may include a silicon oxide, the sacrificial gate electrode layer 195 may include polysilicon, and the sacrificial gate capping layer 196 may include at least one of a silicon oxide, a silicon nitride, or a silicon oxynitride.

The gate spacer layers 116 may be formed on both (e.g., opposite) sidewalls of the sacrificial gate structure 190. The gate spacer layers 116 may be formed of an insulating material, and include, for example, at least one of SiO, SiN, SiCN, SiOC, SiON, or SiOCN.

The source/drain regions 150a to 150f may be formed on the recessed active fins 105a to 105f after removing a portion of the active fins 105a to 105f on opposite sides adjacent to the gate spacer layers 116. The source/drain regions 150a to 150f may be formed using, for example, a selective epitaxial growth (SEG) process. The source/drain regions 150a to 150f may include a semiconductor material doped with impurities, for example, Si, SiGe, or SiC. In particular, the first to third source/drain regions 150a, 150b, and 150c may include p-type impurities, and the fourth to sixth source/drain regions 150d, 150e, and 150f may include n-type impurities. Impurities may be doped in-situ during the formation of source/drain regions 150a to 150f, or may be implanted separately after growth.

The interlayer insulating layer 170 may be formed by performing a planarization process to expose an upper surface of the sacrificial gate structure 190 after depositing an insulating material to cover the sacrificial gate structure 190 and the source/drain regions 150a to 150f. The interlayer insulating layer 170 may include, for example, at least one of an oxide, a nitride, or an oxynitride, and may include a low-k dielectric material.

Figure 6B:
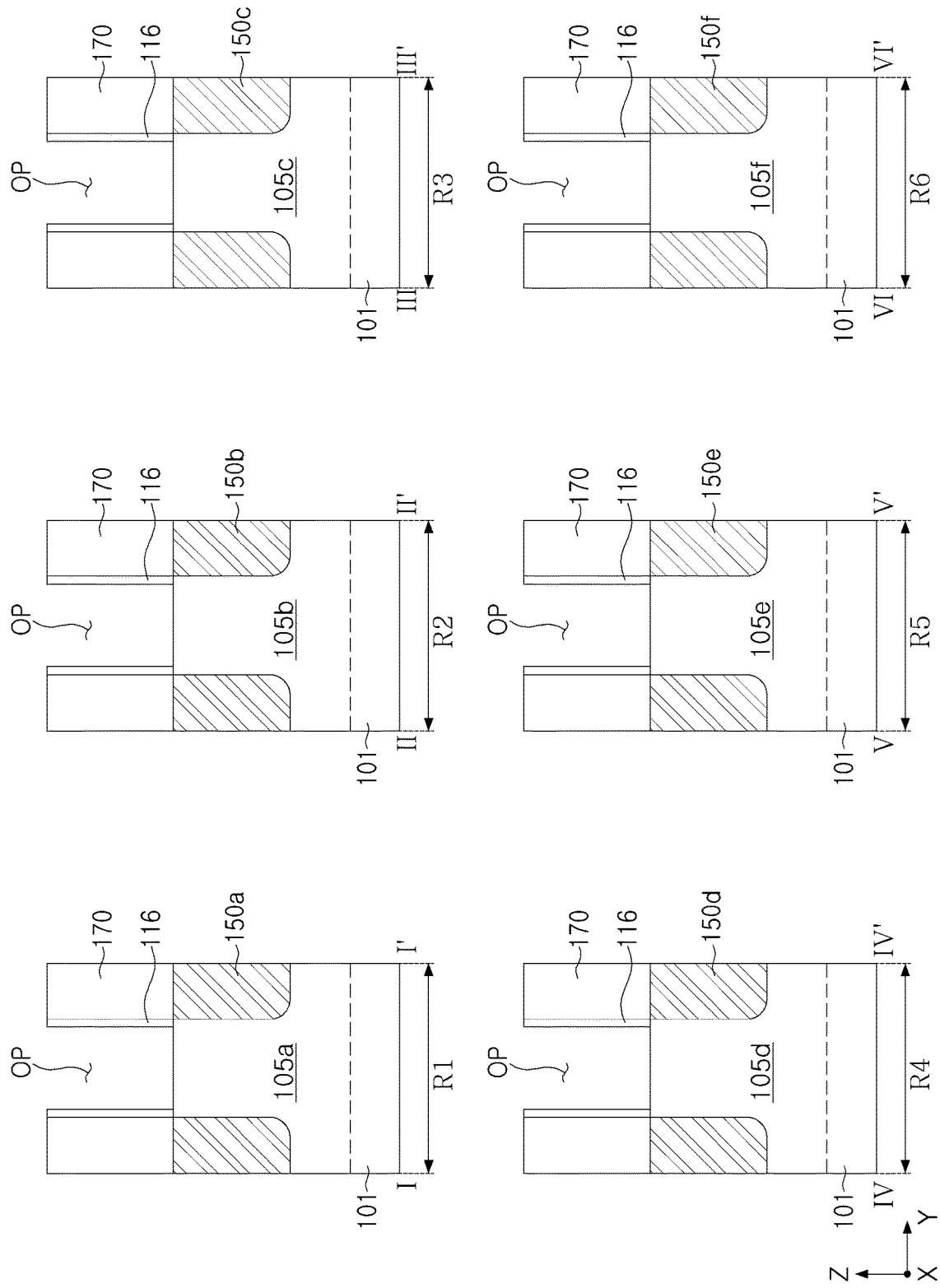
FIGS. 6A to 6O are process flow diagrams illustrating a method of manufacturing a semiconductor device according to example embodiments.

Referring to FIGS. 4 and 6B, the sacrificial gate structure 190 may be removed to form a first opening OP (S20).

The sacrificial gate structure 190 may be selectively removed with respect to the isolation region 107 and the active fins 105a to 105f, such that a first opening OP may be formed to expose the isolation region 107, the active fins 105a to 105f, and the gate spacer layer 116. The process of removing the sacrificial gate structure 190 may employ at least one of a dry etching process or a wet etching process.

Figure 6C:
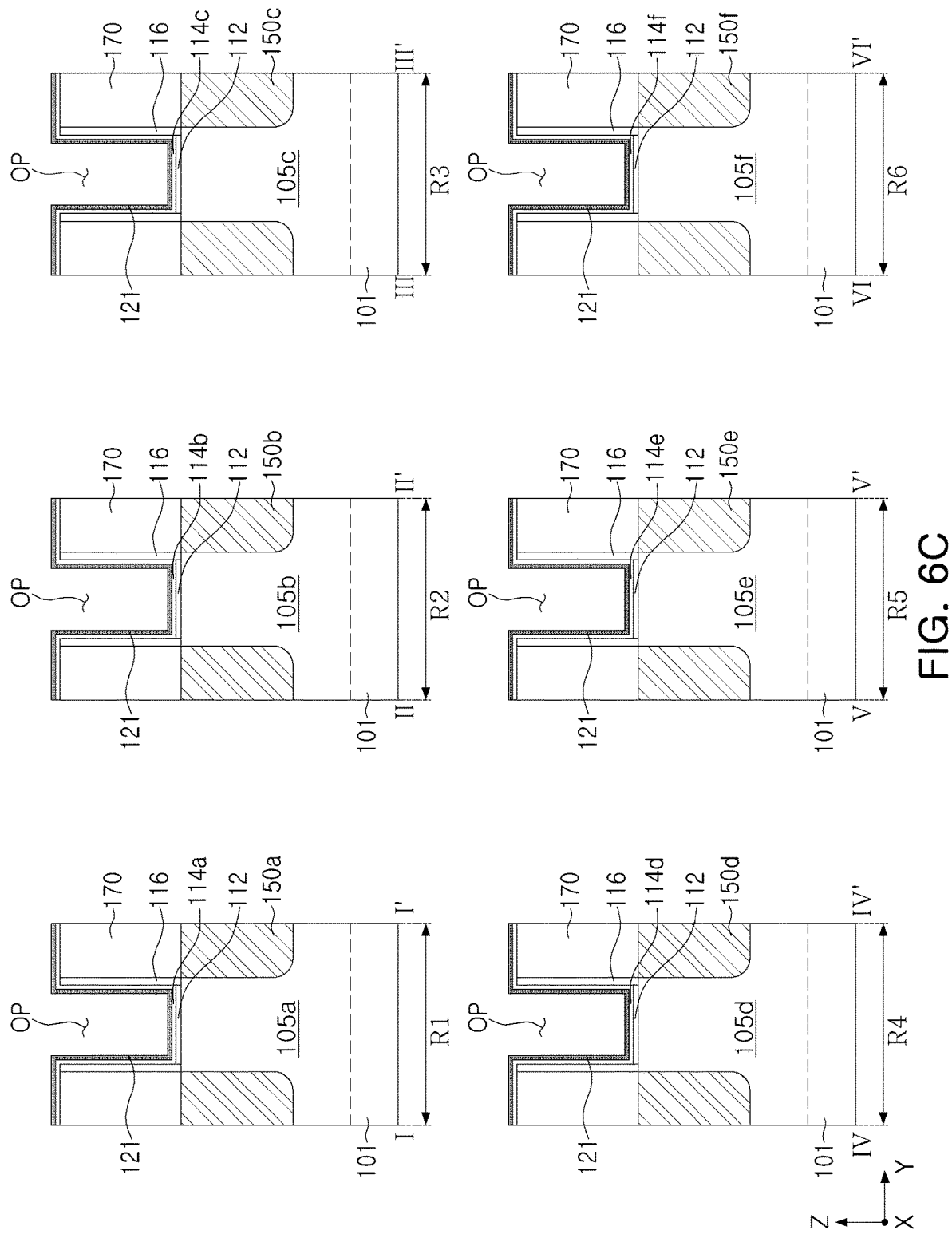
Figure 6D:
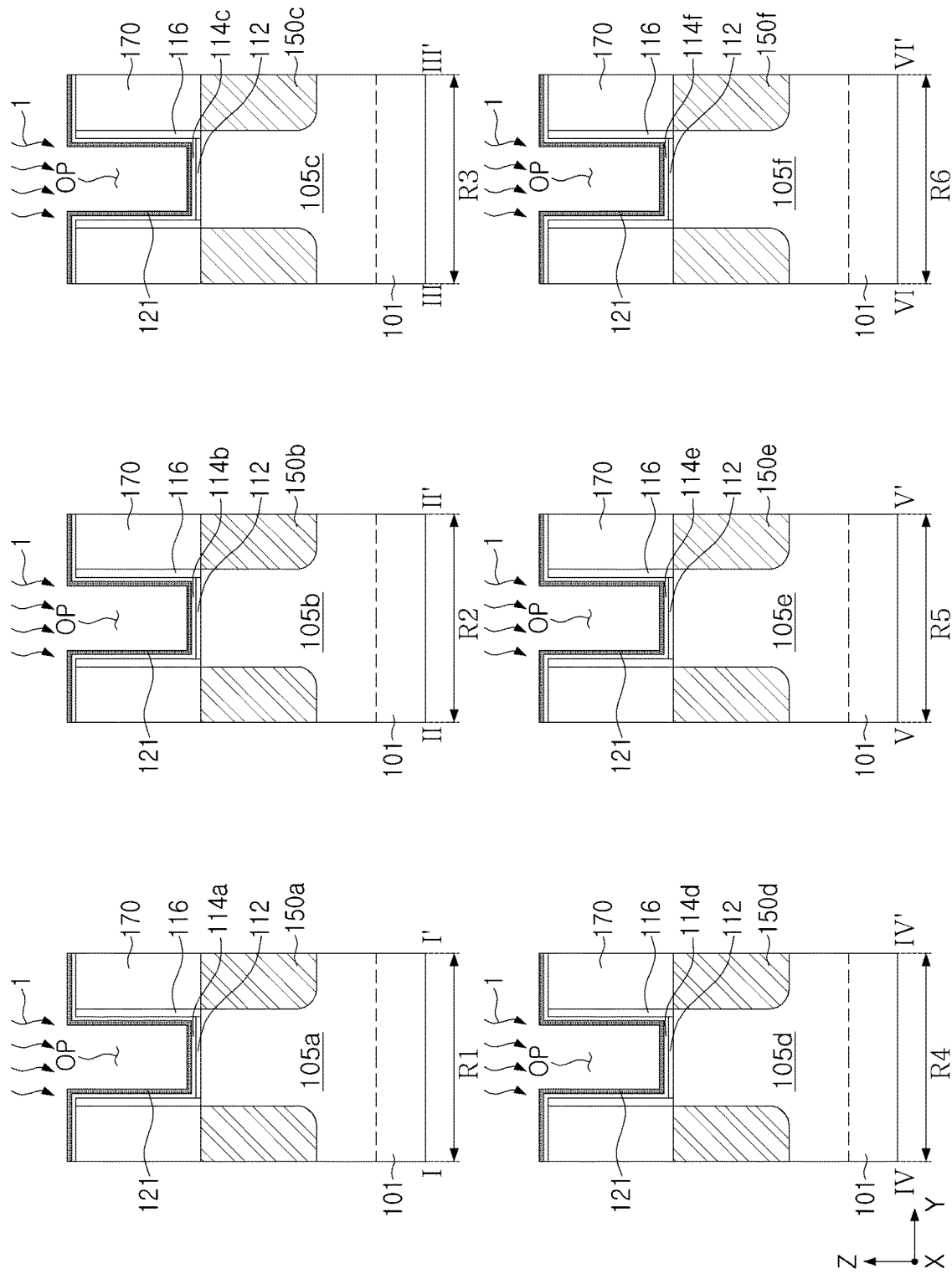

Referring to FIGS. 4 and 6C, the interface layer 112 and the gate dielectric layers 114a to 114f may be formed in the first opening OP (S30). The first layer 121 may be formed in the first to sixth regions R1 to R6 (S40).

The interface layer 112 and the gate dielectric layers 114a to 114f may be formed to have substantially the same thickness in the first to sixth regions R1 to R6. The interface layer 112 may be formed on upper surfaces of the active fins 105a to 105f exposed to a lower surface/level of the first opening OP. According to example embodiments, the interface layer 112 may be formed by oxidizing a portion of each of the active fins 105a to 105f.

The gate dielectric layers 114a to 114f may be formed substantially conformally along a sidewall and a bottom surface of the first opening OP. The process of forming the first, third, and fifth gate dielectric layers 114a, 114c, and 114e and the process of forming the second, fourth, and sixth gate dielectric layers 114b, 114d, and 114f may be performed independently of each other. The gate dielectric layers 114a to 114f may be formed using atomic layer deposition (ALD) or chemical vapor deposition (CVD). The second gate dielectric layer 114b may be formed to further include elements that are not included in the first gate dielectric layer 114a. For example, the first and second gate dielectric layers 114a and 114b may include a hafnium oxide ($HfO_2$), and the second gate dielectric layer 114b may further include a lanthanum hafnium oxide ($LaHf_xO_y$).

The first layer 121 may be a layer constituting a portion of the first conductive layer 120a through a subsequent process. The first layer 121 may be conformally formed on the gate dielectric layers 114a to 114f. The first layer 121 may be formed using atomic layer deposition (ALD) or chemical vapor deposition (CVD). The first layer 121 may include TiN, TaN, TiON, TiSiN, W, WCN, or combinations thereof. The first layer 121 may be formed of the same material as the second to fourth layers 122, 123, and 124 that are formed in a subsequent process.

Referring to FIGS. 4, 5A, 6D, and 7A, a first oxidation treatment process 1 may be performed on the first to sixth regions R1 to R6 (S45).

Figure 7C:
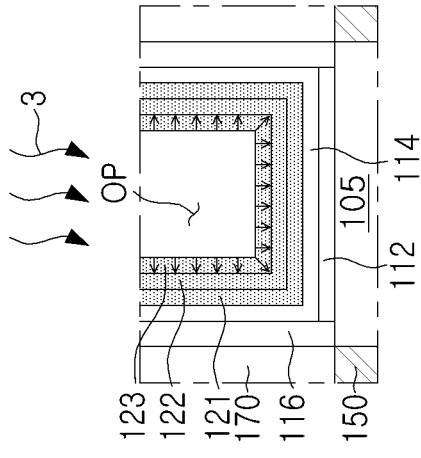
FIGS. 7A to 7F are partially enlarged cross-sectional views of portions of a semiconductor device, illustrating a method of manufacturing the semiconductor device according to example embodiments.
Figure 7F:
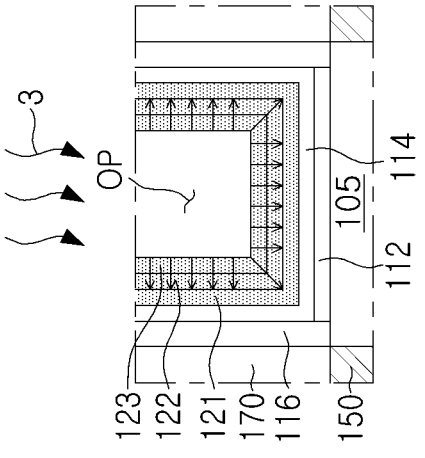
Figure 7B:
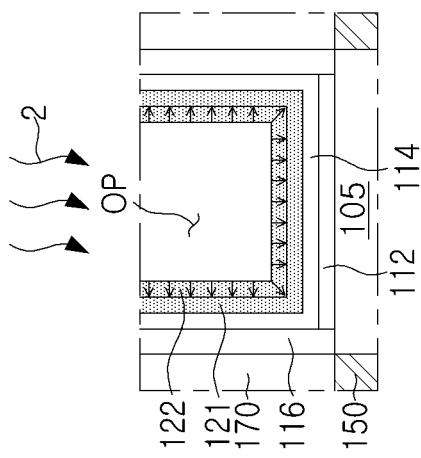
Figure 7E:
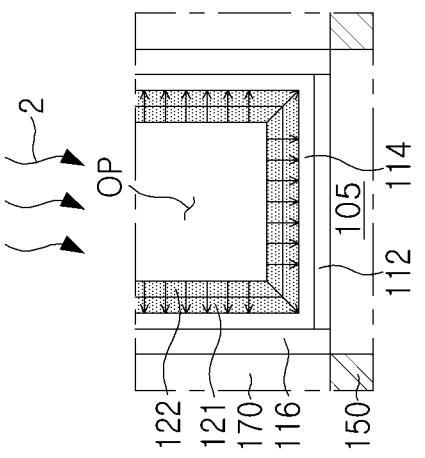
Figure 7A:
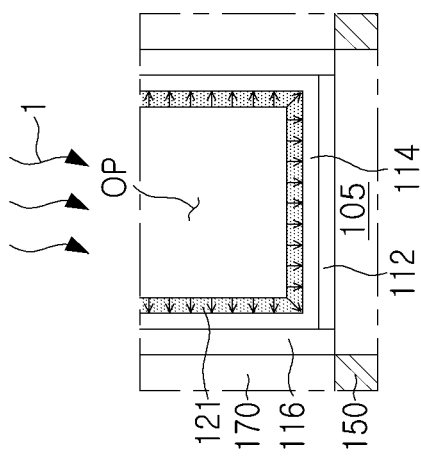

The first oxidation treatment process 1 may be performed using a source gas containing $O_2$, $O_3$, or $H_2O$. The first oxidation treatment process 1 may be an oxygen plasma treatment process. The first layer 121 may be oxidized by the first oxidation treatment process 1. In one embodiment in which the first layer 121 includes TiN, oxygen may be diffused into the first layer 121 from a surface of the first layer 121 by the first oxidation treatment process 1, as illustrated in FIG. 7A, such that TiN of the first layer 121 may be oxidized to be turned into TiON. The first oxidation treatment process 1 may be omitted according to example embodiments.

Figure 6E:
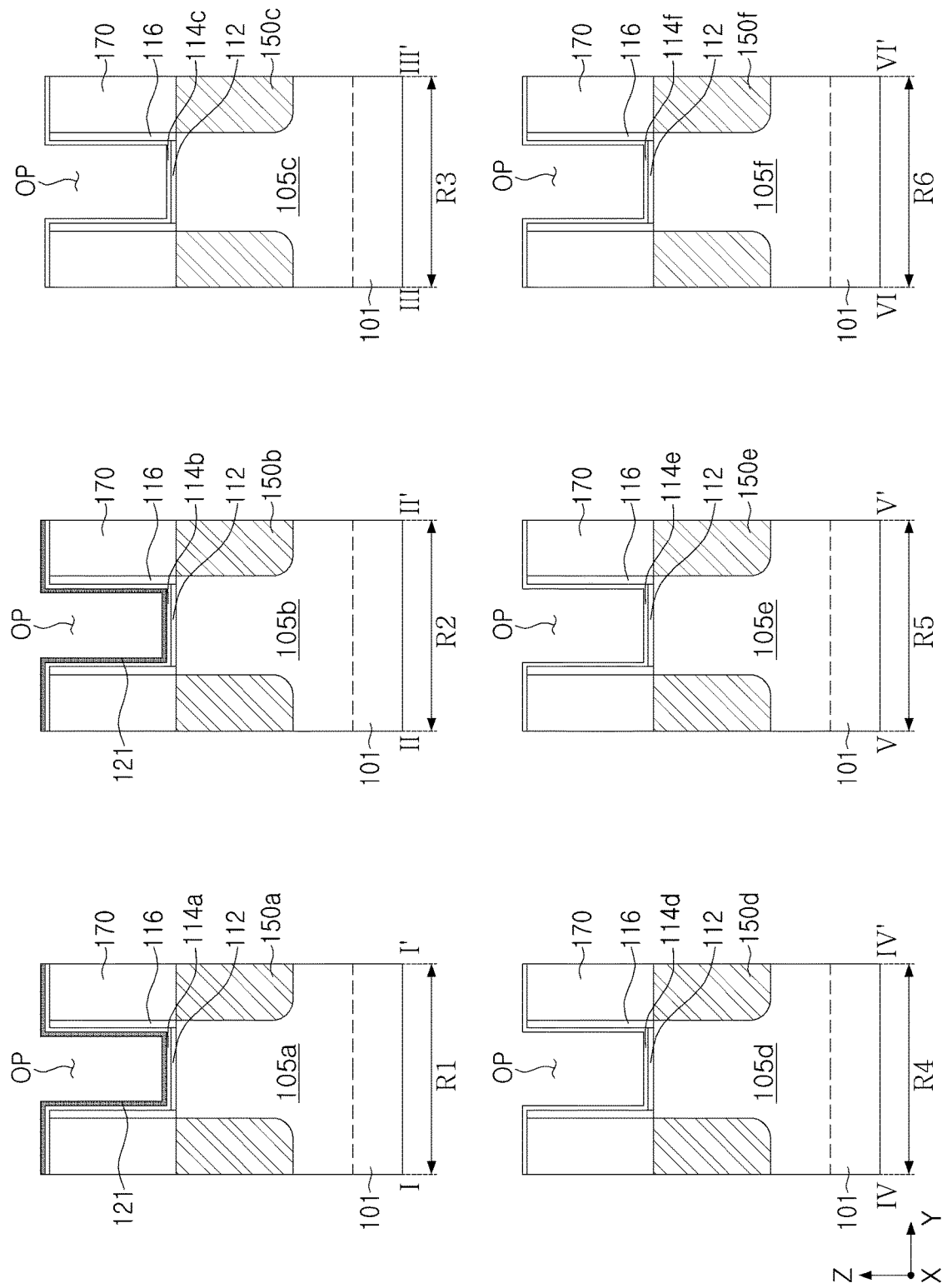

Referring to FIGS. 4 and 6E, the first layer 121 may be removed in the third to sixth regions R3, R4, R5, and R6 (S50).

The first layer 121 may be removed only in the third to sixth regions R3, R4, R5, and R6 after an additional mask layer is performed on the first and second regions R1 and R2. Thus, the first layer 121 may remain in the first and second regions R1 and R2.

Figure 6F:
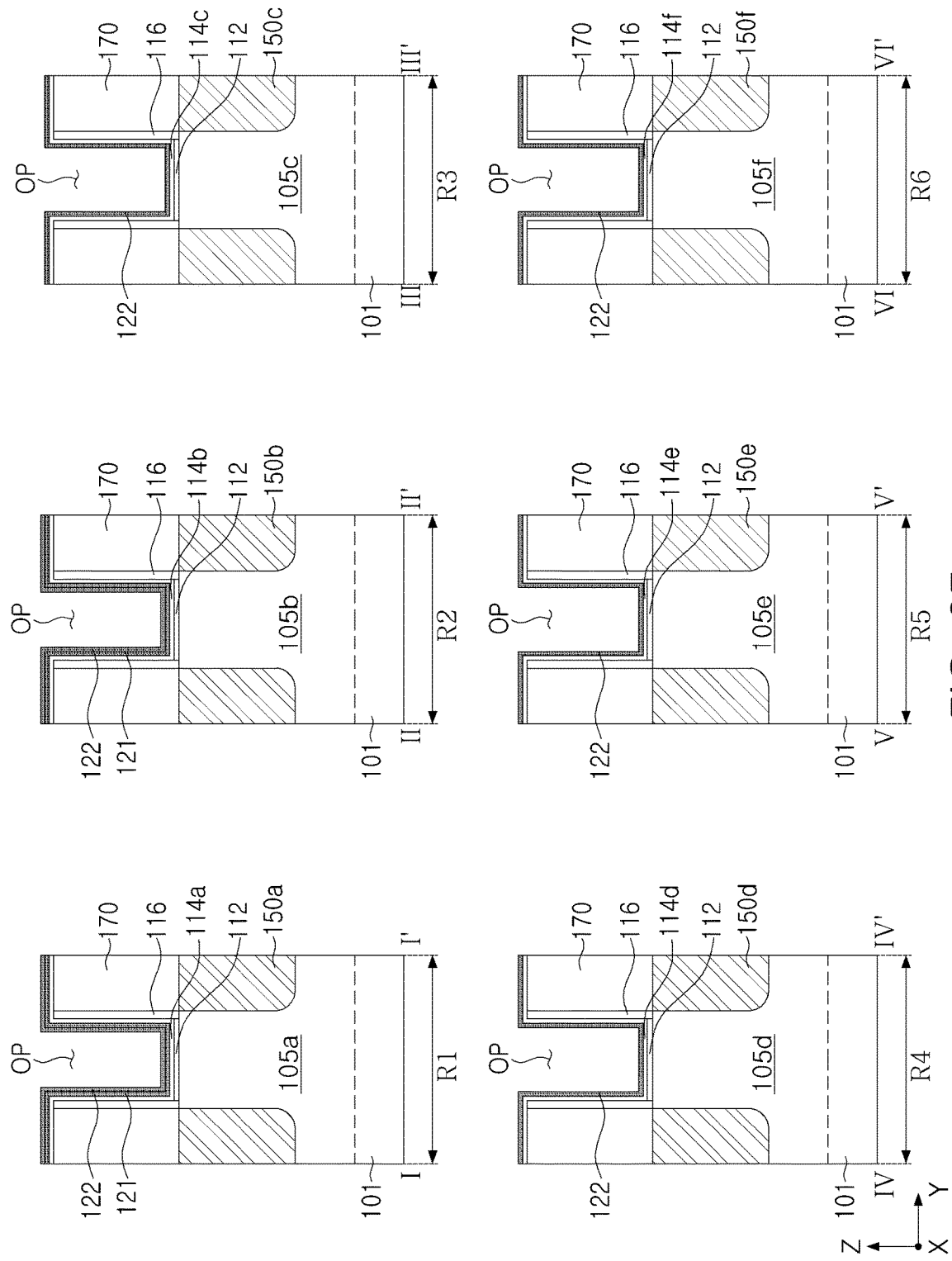
Figure 6G:
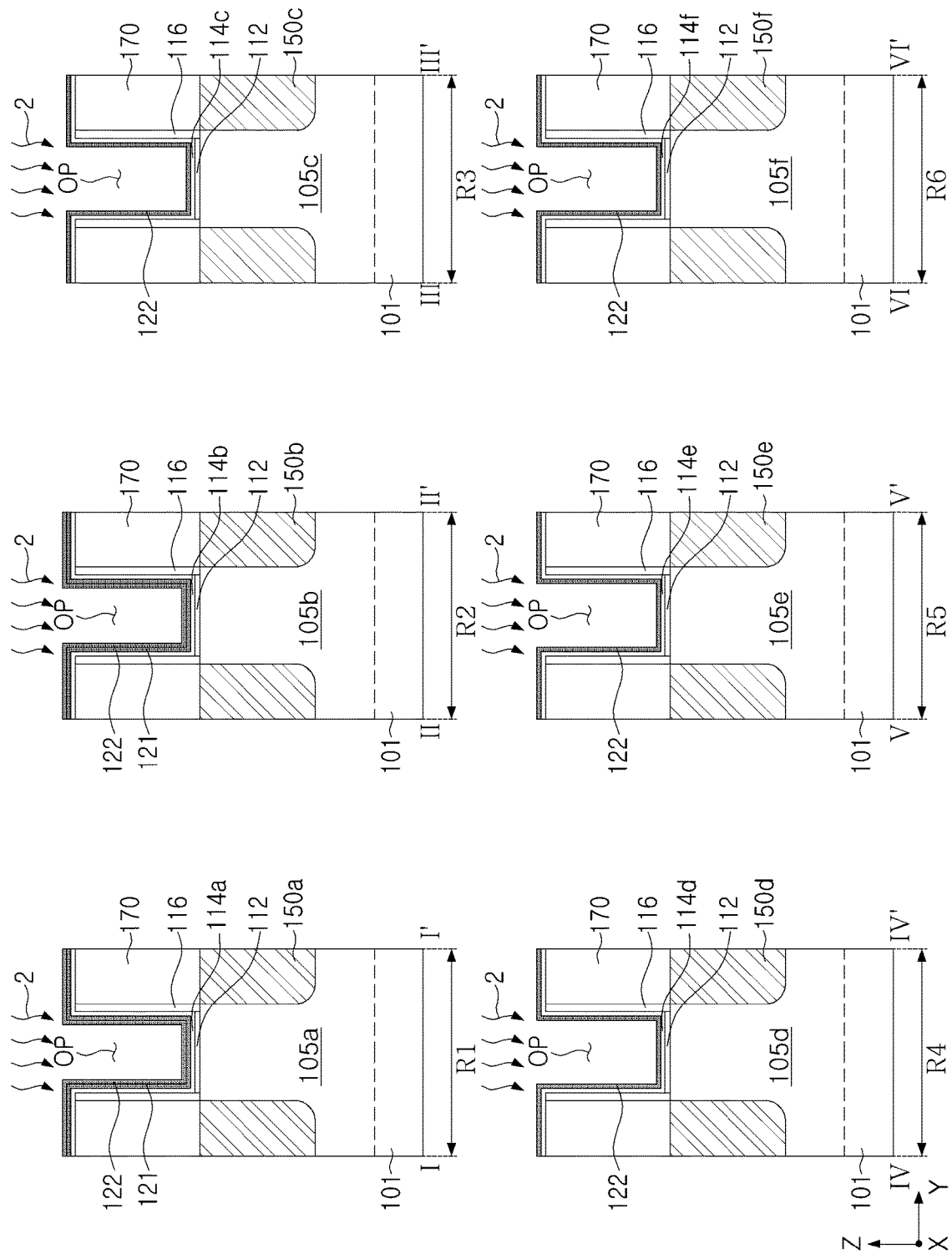

Referring to FIGS. 4 and 6F, the second layer 122 may be formed in the first to sixth regions R1 to R6 (S60).

The second layer 122 may be a layer constituting a portion of the first and second conductive layers 120a and 120b through a subsequent process. The second layer 122 may be conformally formed on the first layer 121 in the first and second regions R1 and R2, and may be conformally formed on the third to sixth gate dielectric layers 114c, 114d, 114e, and 114f in the third to sixth regions R3, R4, R5, and R6.

Referring to FIGS. 4, 5B, 6G, and 7B, a second oxidation treatment process 2 may be performed on the first to sixth regions R1 to R6 (S65).

The second oxidation treatment process 2 may be performed using a source gas containing $O_2$, $O_3$, or $H_2O$. The second oxidation treatment process 2 may be an oxygen plasma treatment process. The second layer 122 may be oxidized by the second oxidation treatment process 2. In one embodiment in which the second layer 122 includes TiN, oxygen may be diffused into the second layer 122 from a surface of the second layer 122 by the second oxidation treatment process 2, as illustrated in FIG. 7B, such that TiN of the second layer 122 may be turned into TiON. The second oxidation treatment process 2 may be omitted according to example embodiments.

In an example embodiment, a depth at which oxygen is diffused in the first and second layers 121 and 122 by the second oxidation treatment process 2 may be changed. For example, as illustrated in FIG. 7E, oxygen may be diffused from a surface of the second layer 122 by the second oxidation treatment process 2 to turn TiN of the first and second layers 121 and 122 into TiON. In this case, the first oxidation treatment process 1 may be omitted.

The first and second oxidation treatment processes 1 and 2 may be performed to turn TiN of each of the first and second layers 121 and 122 into TiON. However, a diffusion depth of oxygen may be adjusted during the second oxidation treatment process 2 without performing the first oxidation treatment process 1 to turn TiN of each of the first and second layers 121 and 122 into TiON.

Figure 6H:
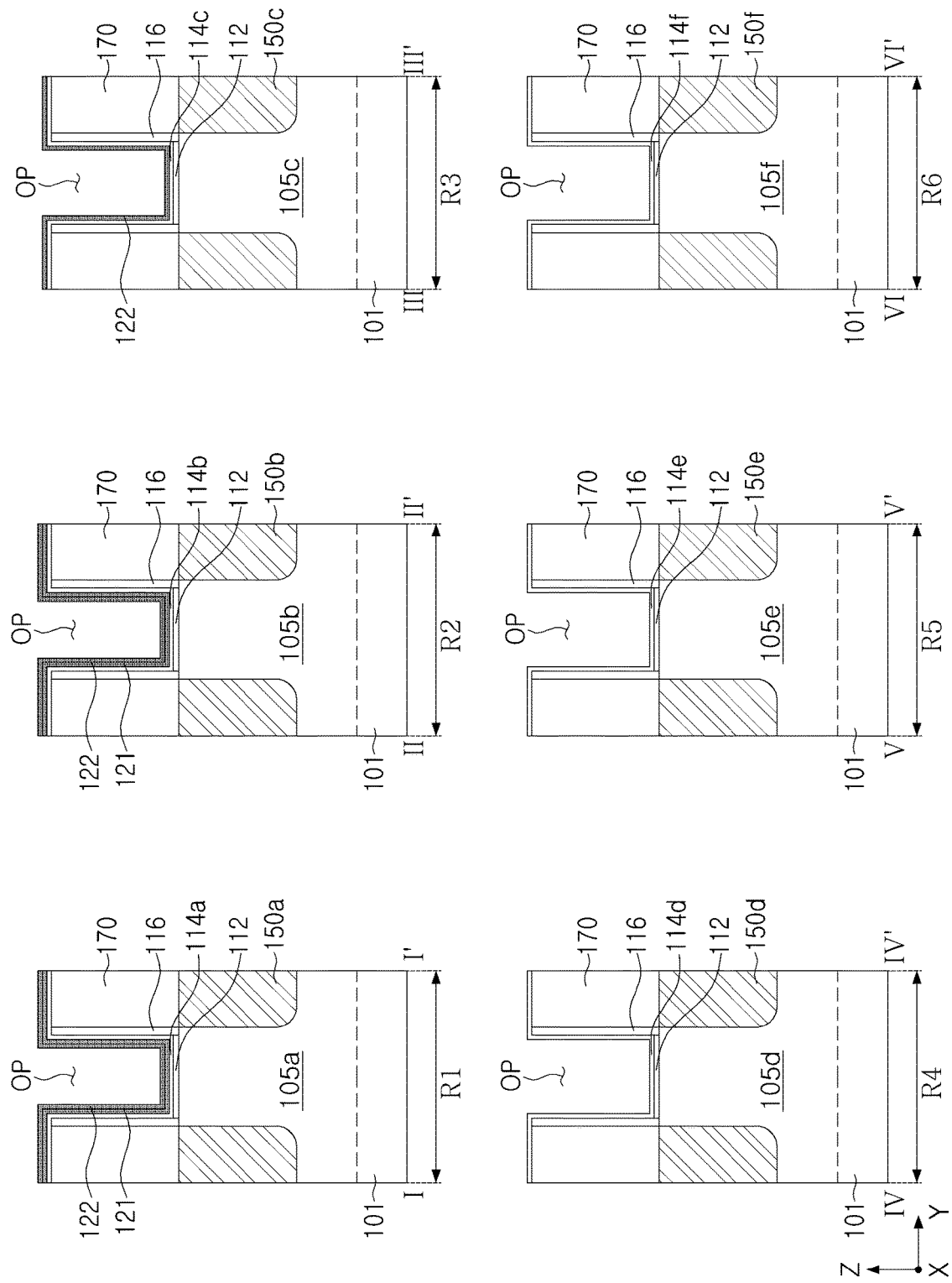

Referring to FIGS. 4 and 6H, the second layer 122 may be removed in the fourth to sixth regions R4, R5, and R6 (S70).

The second layer 122 may be removed only in the fourth to sixth regions R4, R5, and R6 after an additional mask layer is formed on the first to third regions R1, R2, and R3. Thus, the second layer 122 may remain in the first to third regions R1, R2, and R3.

Figure 6I:
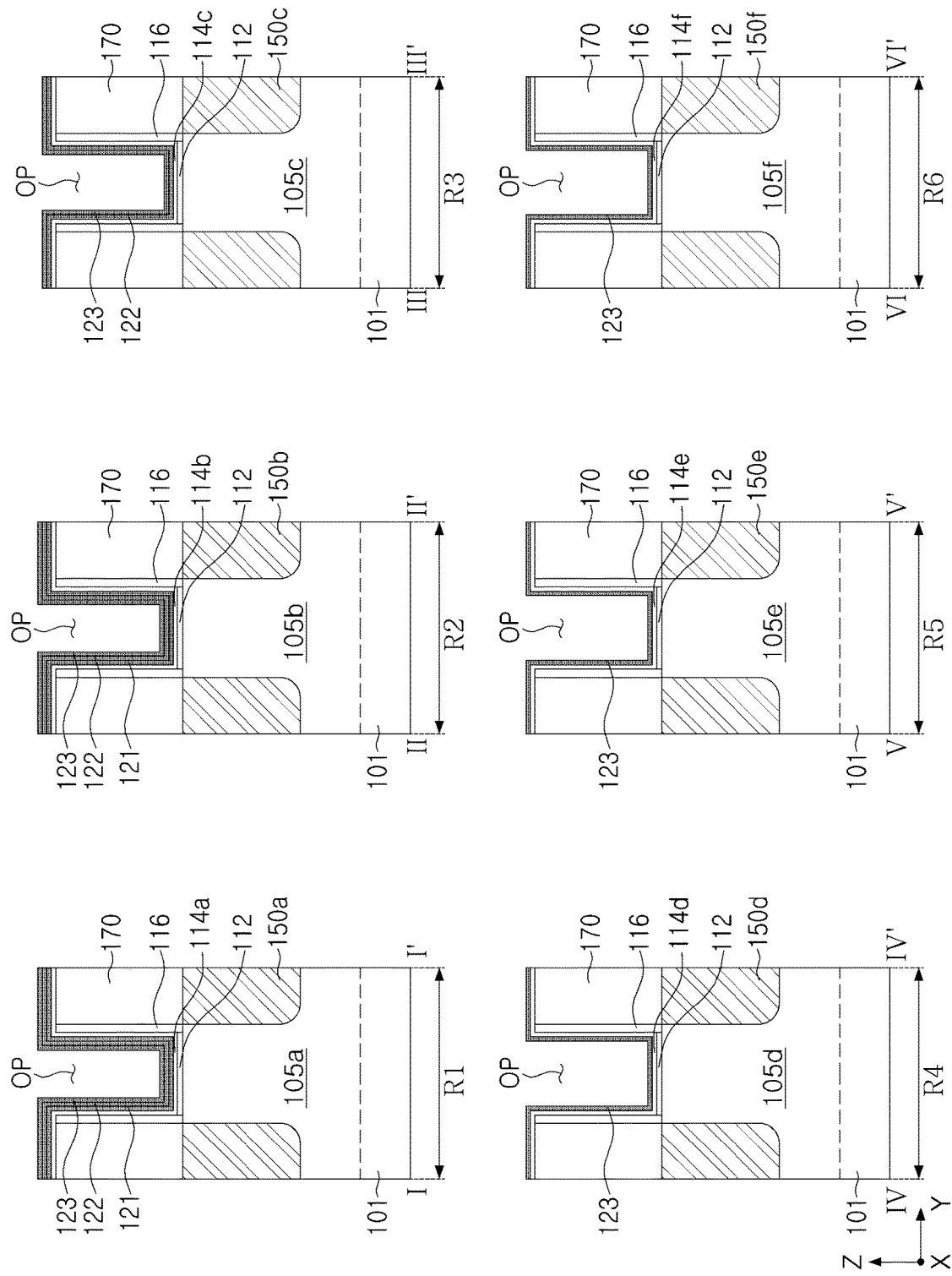
Figure 6J:
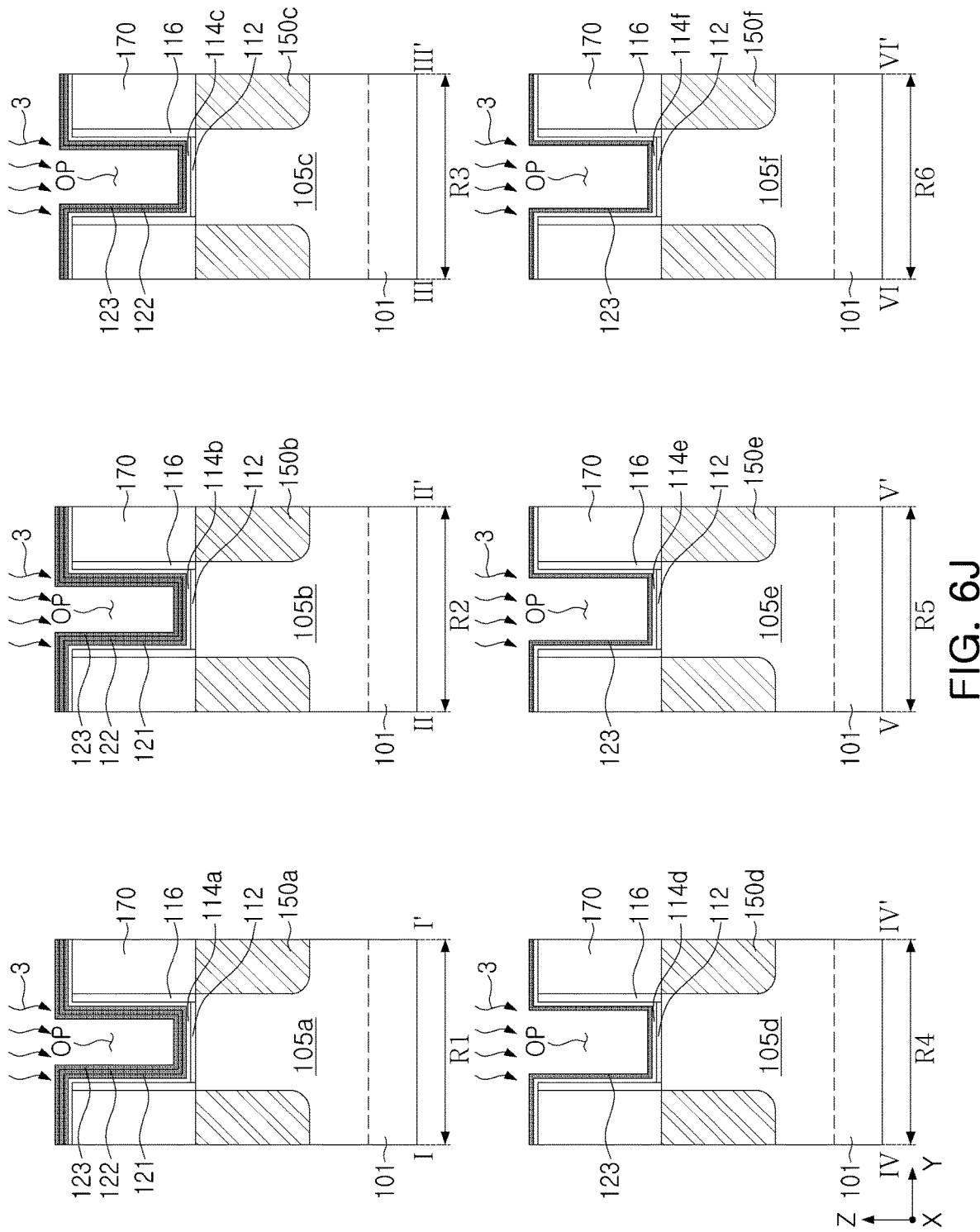

Referring to FIGS. 4 and 6I, the third layer 123 may be formed in the first to sixth regions R1 to R6 (S80).

The third layer 123 may be a layer constituting a portion of the first to third conductive layers 120a, 120b, and 120c through a subsequent process. The third layer 123 may be conformally formed on the second layer 122 in the first to third regions R1, R2 and R3, and may be conformally formed on the fourth to sixth gate dielectric layers 114d, 114e, and 114f in the fourth to sixth regions R4, R5 and R6.

Referring to FIGS. 4, 5C, 6J, and 7C, a third oxidation treatment process 3 may be performed on the first to sixth regions R1 to R6 (S85).

The third oxidation treatment process 3 may be performed using a source gas containing $O_2$, $O_3$, or $H_2O$. The third oxidation treatment process 3 may be an oxygen plasma treatment process. The third layer 123 may be oxidized by the third oxidation treatment process 3. In one embodiment in which the third layer 123 includes TiN, oxygen is diffused into the third layer 123 from a surface of the third layer 123 by the third oxidation treatment process 3, as illustrated in FIG. 7C, such that TiN of the third layer 123 may be turned into TiON. The third oxidation treatment process 3 may be omitted according to example embodiments.

In an example embodiment, a depth at which oxygen is diffused in the first to third layers 121, 122, and 123 by the third oxidation treatment process 3 may be changed. For example, as illustrated in FIG. 7F, oxygen may be diffused from a surface of the third layer 123 by the third oxidation treatment process 3 to turn TiN of the second and third layers 122 and 123 into TiON. In this case, the second oxidation treatment process 2 may be omitted.

The second and third oxidation treatment processes 2 and 3 may be performed to turn TiN of each of the second and third layers 122 and 123 into TiON. However, a diffusion depth of oxygen may be adjusted during the third oxidation treatment process 3 without performing the second oxidation treatment process 2 to turn TiN of each of the second and third layers 122 and 123 into TiON.

Figure 6K:
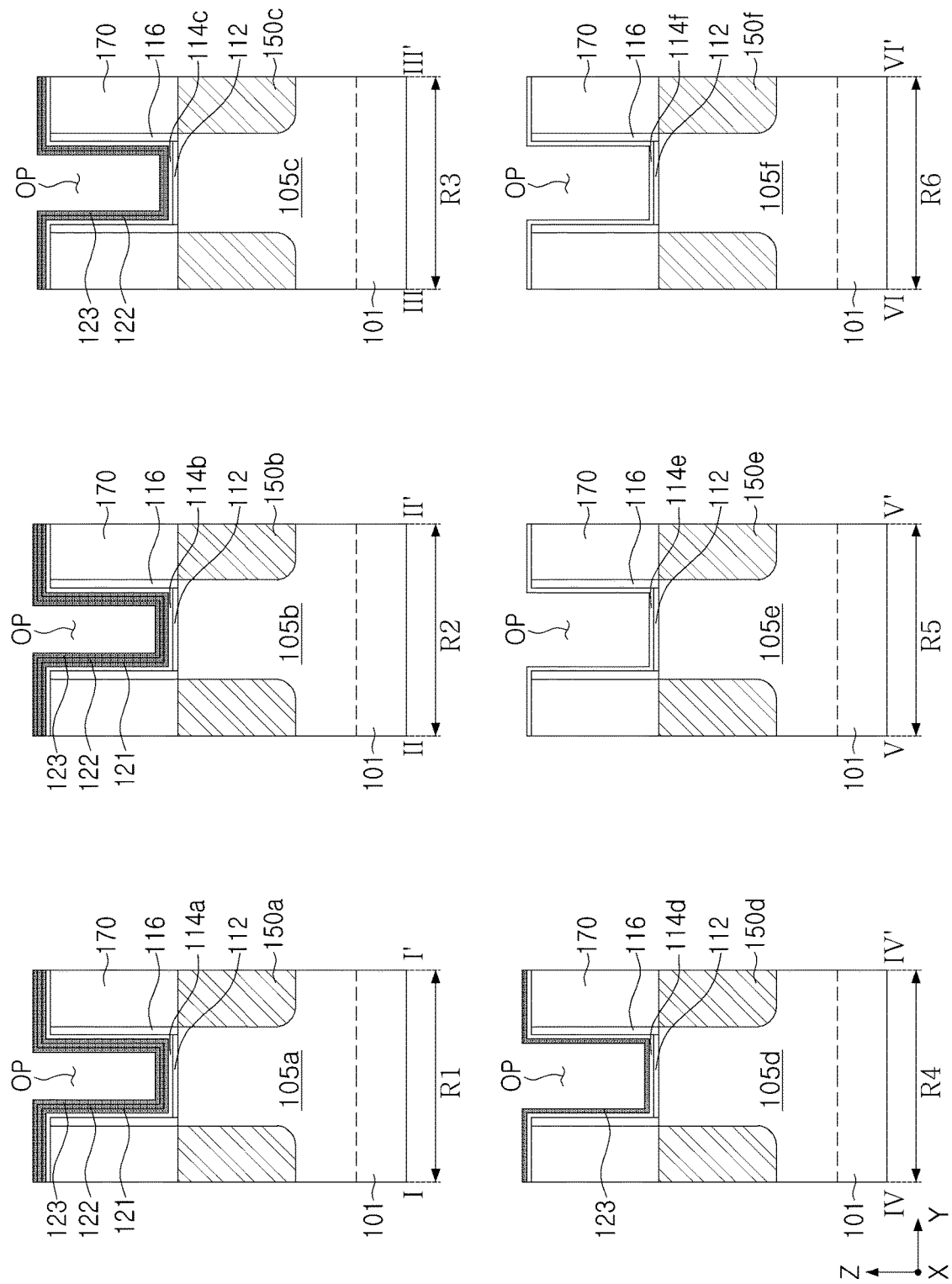

Referring to FIGS. 4 and 6K, the third layer 123 may be removed in the fifth and sixth regions R5 and R6 (S90).

The third layer 123 is removed only in the fifth and sixth regions R5 and R6 after an additional mask layer is formed on the first to fourth regions R1, R2, R3, and R4. Thus, the third layer 123 may remain in the first to fourth regions R1, R2, R3, and R4.

Figure 6L:
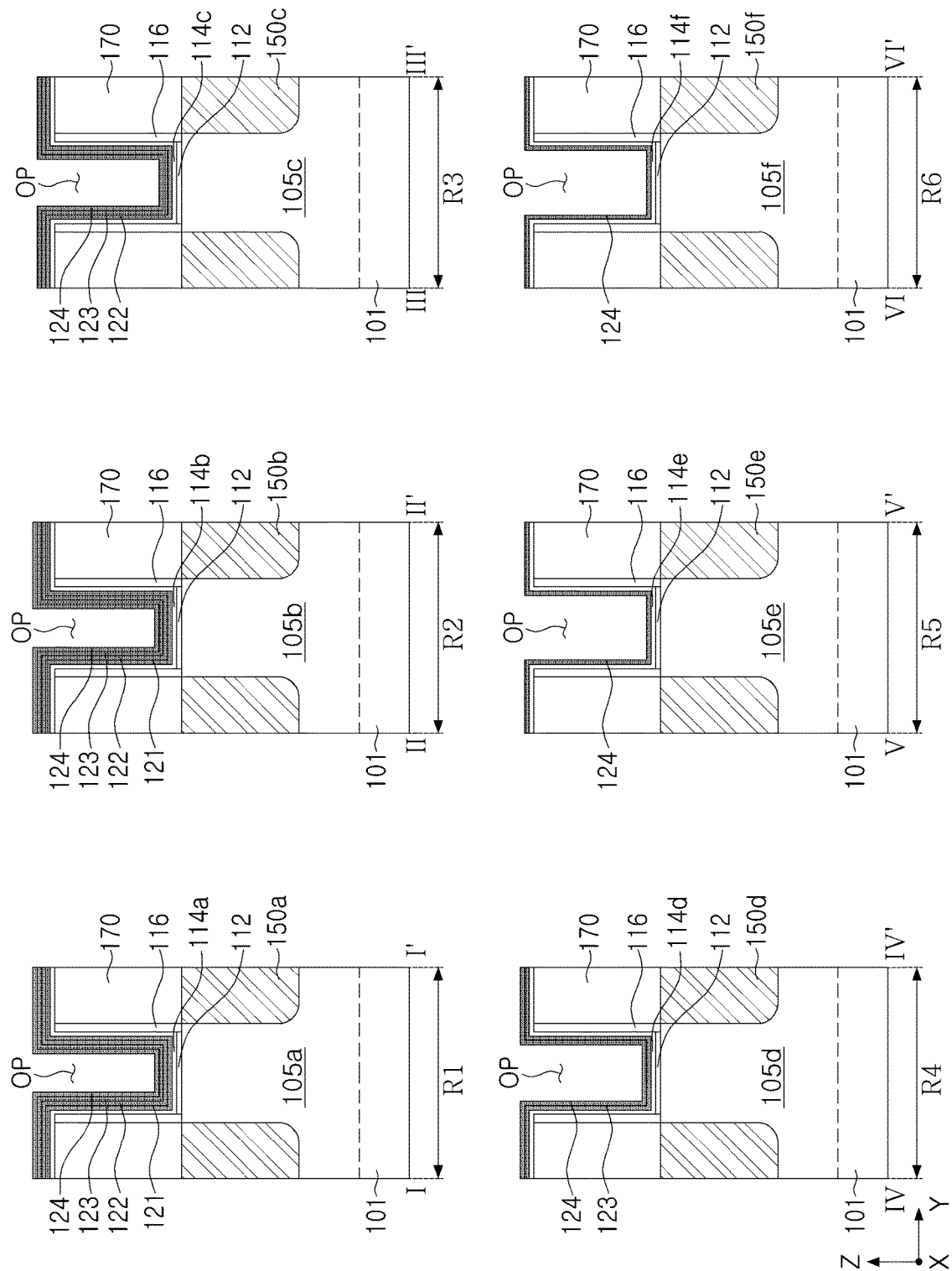
Figure 6M:
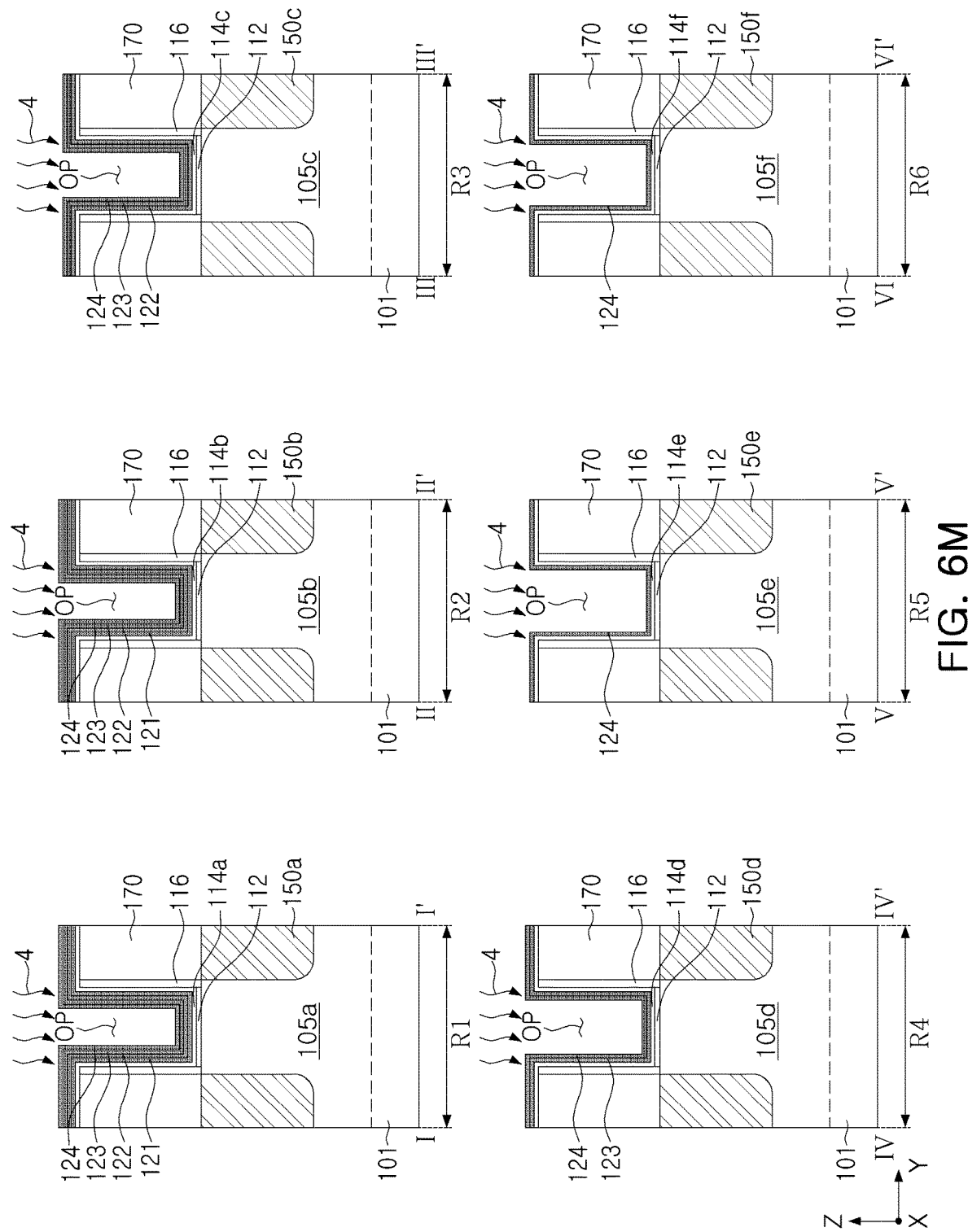

Referring to FIGS. 4 and 6L, the fourth layer 124 may be formed in the first to sixth regions R1 to R6 (S100).

The fourth layer 124 may be a layer constituting a portion of the first to third conductive layers 120a, 120b, and 120c through a subsequent process. The fourth layer 124 may be conformally formed on the third layer 123 in the first to fourth regions R1, R2, R3, and R4, and may be conformally formed on the fifth and sixth gate dielectric layers 114e and 114f in the fifth and sixth regions R5 and R6.

Referring to FIGS. 4, 5D, 6M, and 7D, a fourth oxidation treatment process 4 may be performed on the first to sixth regions R1 to R6 (S105).

Figure 7D:
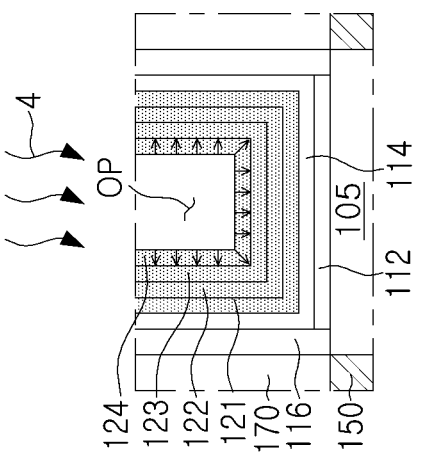

The fourth oxidation treatment process 4 may be performed using a source gas containing $O_2$, $O_3$, or $H_2O$. The fourth oxidation treatment process 4 may be an oxygen plasma treatment process. The fourth layer 124 may be oxidized by the fourth oxidation treatment process 4. In one embodiment in which the fourth layer 124 includes TiN, oxygen may be diffused into the fourth layer 124 from a surface of the fourth layer 124 by the fourth oxidation treatment process 4, as illustrated in FIG. 7D, such that TiN of the fourth layer 124 may be turned into TiON. The fourth oxidation treatment process 4 may be omitted according to example embodiments.

Figure 6N:
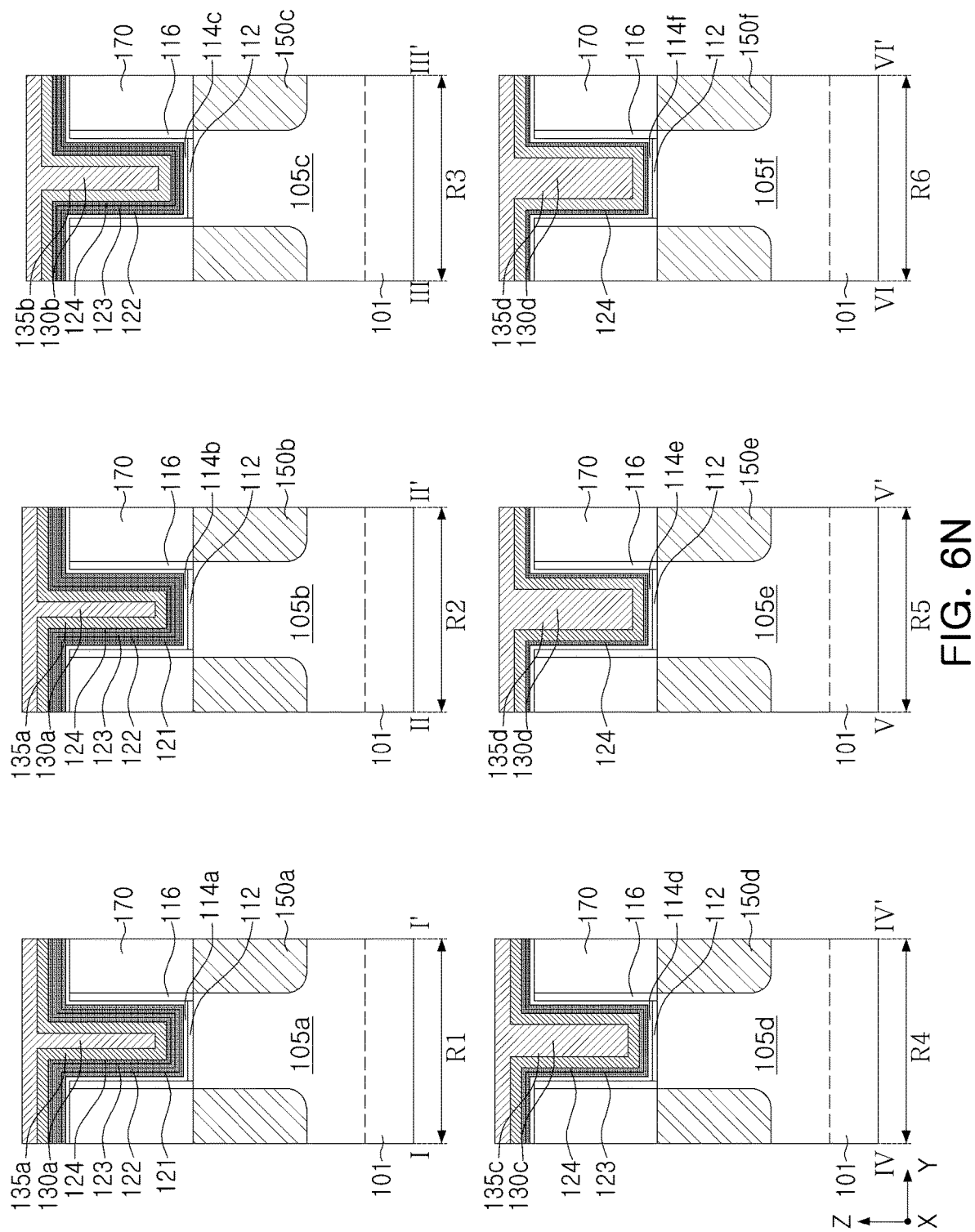
Figure 60:
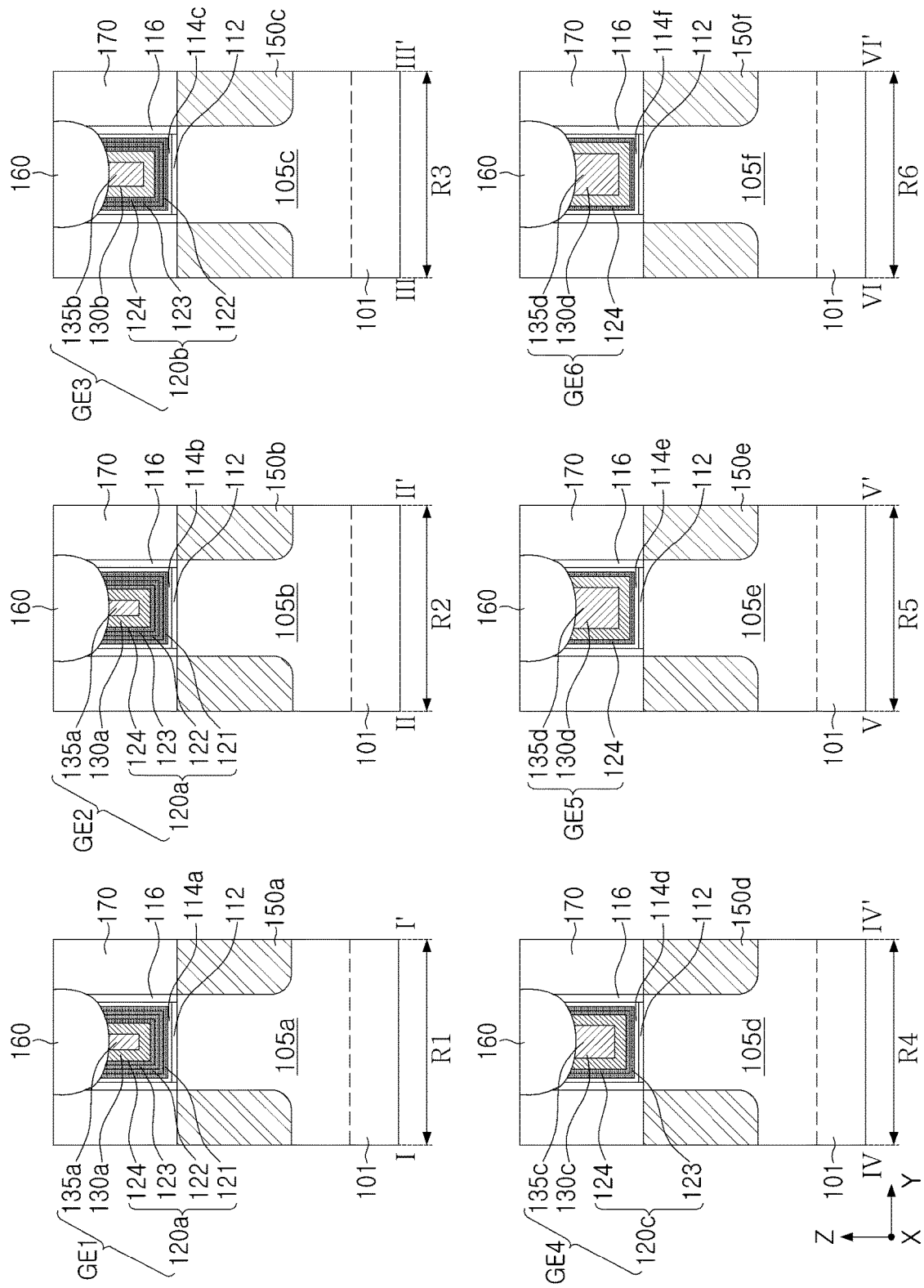

Referring to FIGS. 4, 6N, and 60, upper conductive layers 130a, 130b, 130c, and 130d and internal conductive layers 135a, 135b, 135c, and 135d may be formed in the first to sixth regions R1 to R6 (S110). The gate capping layer 160 may be formed on the first to sixth gate electrode layers GE1 to GE6 (S120).

The upper conductive layers 130a, 130b, 130c, and 130d and the internal conductive layers 135a, 135b, 135c, and 135d may be formed in the first opening OP in the first to sixth regions R1 to R6.

After the upper conductive layers 130a, 130b, 130c, and 130d and the internal conductive layers 135a, 135b, 135c, and 135d are formed, a portion of the first to fourth layers 121, 122, 123, and 124, the upper conductive layers 130a, 130b, 130c, and 130d, and the internal conductive layers 135a, 135b, 135c, and 135d may be removed on the interlayer insulating layer 170. The removal process may employ a planarization process such as a chemical mechanical polishing (CMP) process.

An upper portion of the gate spacer layers 116, first to fourth layers 121, 122, 123, and 124, upper conductive layers 130a, 130b, 130c, and 130d, and internal conductive layers 135a, 135b, 135c, and 135d may be removed, and the gate capping layer 160 may be formed in the removed portion. Thus, the first to sixth gate electrode layers GE1 to GE6 may be finally formed in the first to sixth regions R1 to R6, and the first to sixth transistors 10, 20, 30, 40, 50, and 60 may be formed.

Referring again to FIG. 2A, contact structures 180 may be formed to be connected to the source/drain regions 150a to 150f by extending through the interlayer insulating layer 170. As a result, the semiconductor device 100 of FIGS. 1 to 2B may be manufactured.

FIGS. 8A to 8D are process flow diagrams illustrating a method of manufacturing a semiconductor device according to example embodiments. FIGS. 8A to 8D illustrate an example embodiment of a method of manufacturing the semiconductor device of FIGS. 3A and 3B.

Figure 8A:
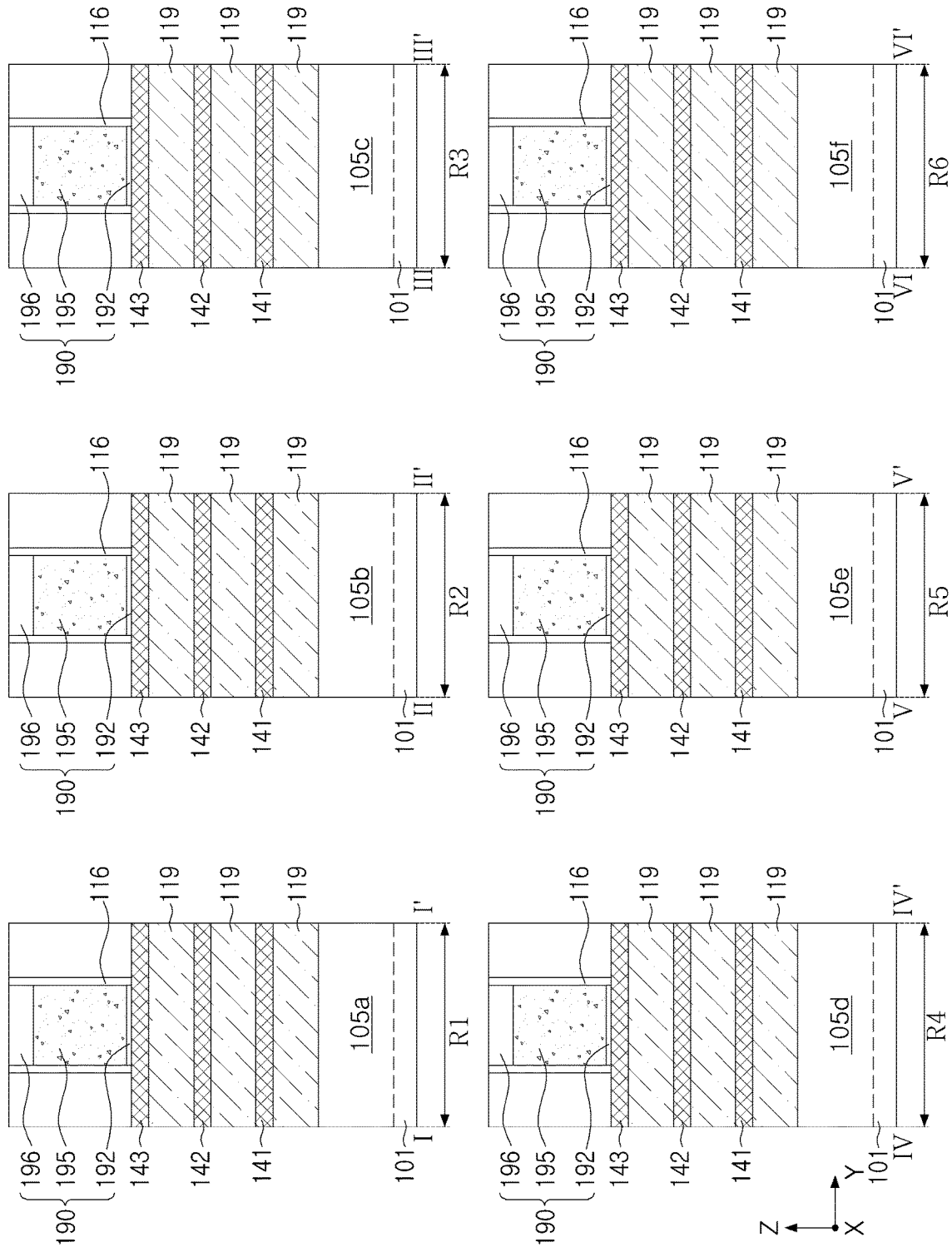
FIGS. 8A to 8D are process flow diagrams illustrating a method of manufacturing a semiconductor device according to example embodiments.

Referring to FIG. 8A, sacrificial layers 119 and channel layers 141, 142, and 143 may be alternately stacked on a substrate 101 having first to sixth regions R1 to R6. The substrate 101, the sacrificial layers 119, and the channel layers 141, 142, and 143 may be patterned to form active fins 105a to 105f. A sacrificial gate structure 190 and gate spacer layers 116 may be formed across the active fins 105a to 105f. Processes of forming the active fins 105a to 105f, isolation regions 107, gate spacer layers 116, and sacrificial gate structure 190 are the same as or similar to those described with reference to FIGS. 4 and 6A, and thus, descriptions thereof will be omitted.

The sacrificial layers 119 may be replaced with first to sixth gate electrode layers GE1 to GE6 in a subsequent process, as illustrated in FIGS. 3A and 3B. The sacrificial layers 119 may be formed of a material having an etching selectivity with respect to the channel layers 141, 142, and 143. The sacrificial layers 119 and the channel layers 141, 142, and 143 include, for example, a semiconductor material including at least one of silicon (Si), silicon-germanium (SiGe), or germanium (Ge) and may include different materials. In addition, the sacrificial layers 119 and the channel layers 141, 142, and 143 may or may not include impurities. For example, the sacrificial layers 119 may include silicon-germanium (SiGe), and the channel layers 141, 142, and 143 may include silicon (Si).

The sacrificial layers 119 and the channel layers 141, 142, and 143 may be formed by performing an epitaxial growth process using the substrate 101 as a seed. The number of the channel layers 141, 142, and 143, alternately stacked with the sacrificial layers 119, may vary according to example embodiments.

Figure 8B:
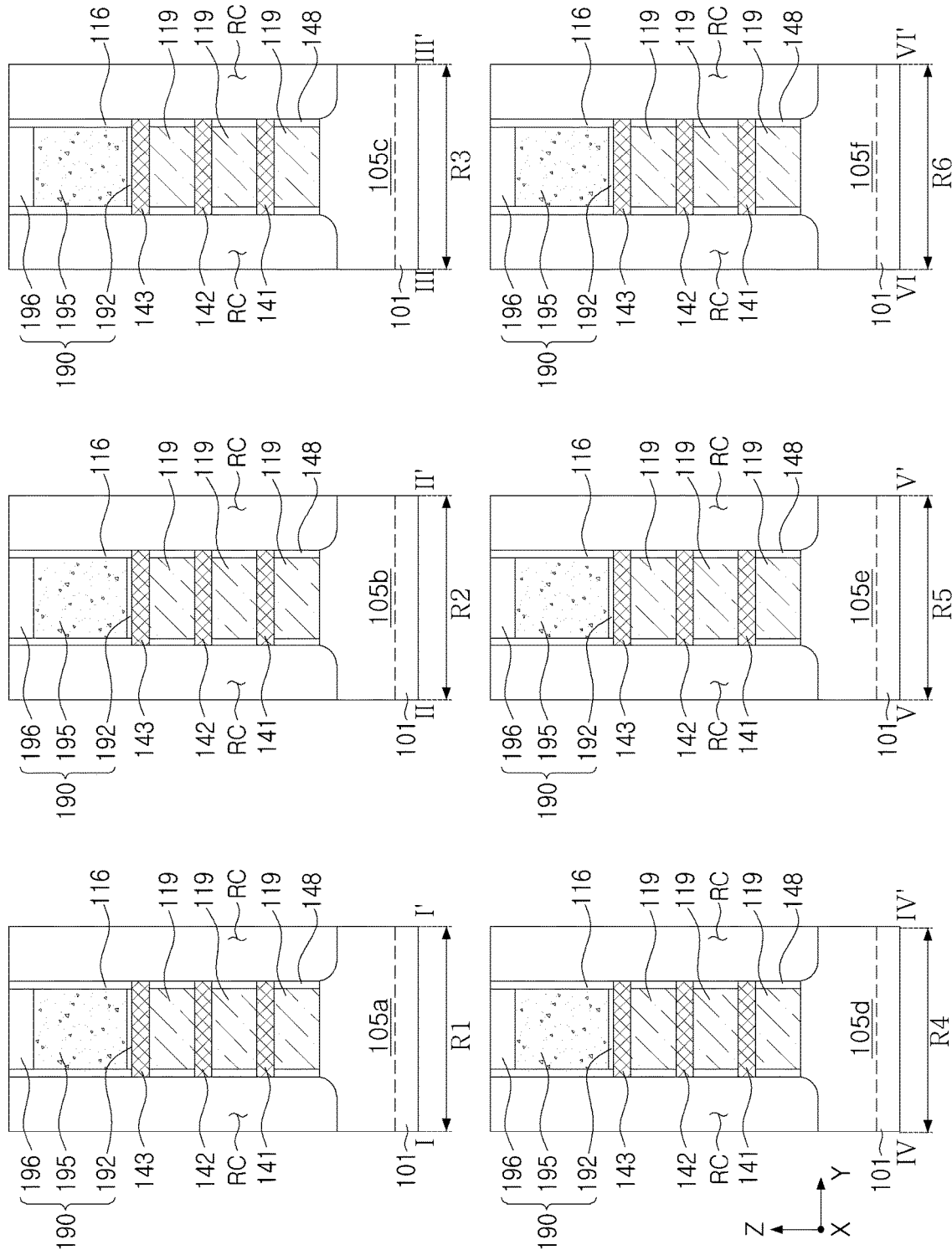

Referring to FIG. 8B, exposed portions of the sacrificial layers 119 and the channel layers 141, 142, and 143 are removed on opposite sides adjacent to the sacrificial gate structure 190 to form a recessed region RC. Thus, the channel structures 140a to 140f may be formed. A portion of the exposed sacrificial layers 119 may be removed from side surface thereof. Internal spacer layers 148 may be formed in a region in which a portion of the sacrificial layers 119 is removed.

Exposed portions of sacrificial layers 119 and channel layers 141, 142, and 143 may be removed using the sacrificial gate structure 190 and the gate spacer layers 116 as masks. Accordingly, the channel layers 141, 142, and 143 have a defined length in an X direction and constitute channel structures 140a to 140f.

The sacrificial layers 119 may be selectively etched with respect to the channel structures 140a to 140f by, for example, a wet etching process to be removed to a certain depth from side surfaces thereof in the X direction. Due to the etching of the side surfaces, the sacrificial layers 119 may have inwardly concave side surfaces.

The internal spacer layers 148 may be formed by filling an insulating material in a region, in which the sacrificial layers 119 are removed, and removing the insulating material deposited on external sides of the channel structures 140a to 140f.

Figure 8C:
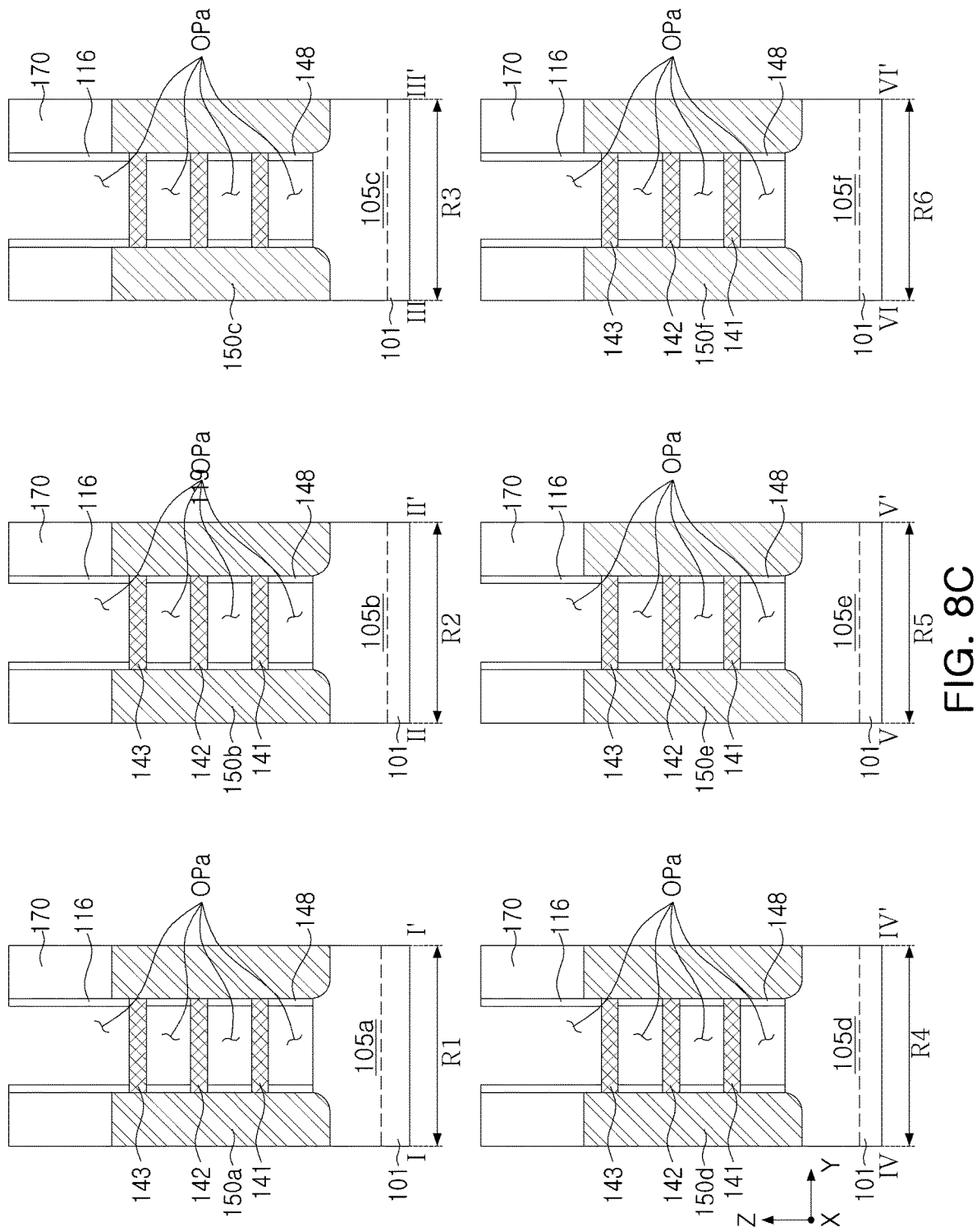

Referring to FIG. 8C, on opposite sides adjacent to the sacrificial gate structures 190, source/drain regions 150a to 150f may be formed on the active fins 105a to 105f and an interlayer insulating layer 170 is formed. Then, the sacrificial gate structures 190 may be removed to form a second opening OPa. Processes of forming the source/drain regions 150a to 150f and the interlayer insulating layer 170 are the same as or similar to those described with reference to FIGS. 4 and 6A, and thus, descriptions thereof will be omitted. However, upper surfaces of the source/drain regions 150a to 150f may be disposed to be higher than an upper surface of the third channel layer 143.

The sacrificial gate structure 190 may be selectively removed with respect to the isolation region 107, the active fins 105a to 105f, and the channel structures 140a to 140f disposed therebelow. Thus, the isolation region 107, the active fins 105a to 105f, the gate spacer layers 116, and the internal spacer layers 148 may be exposed.

Figure 8D:
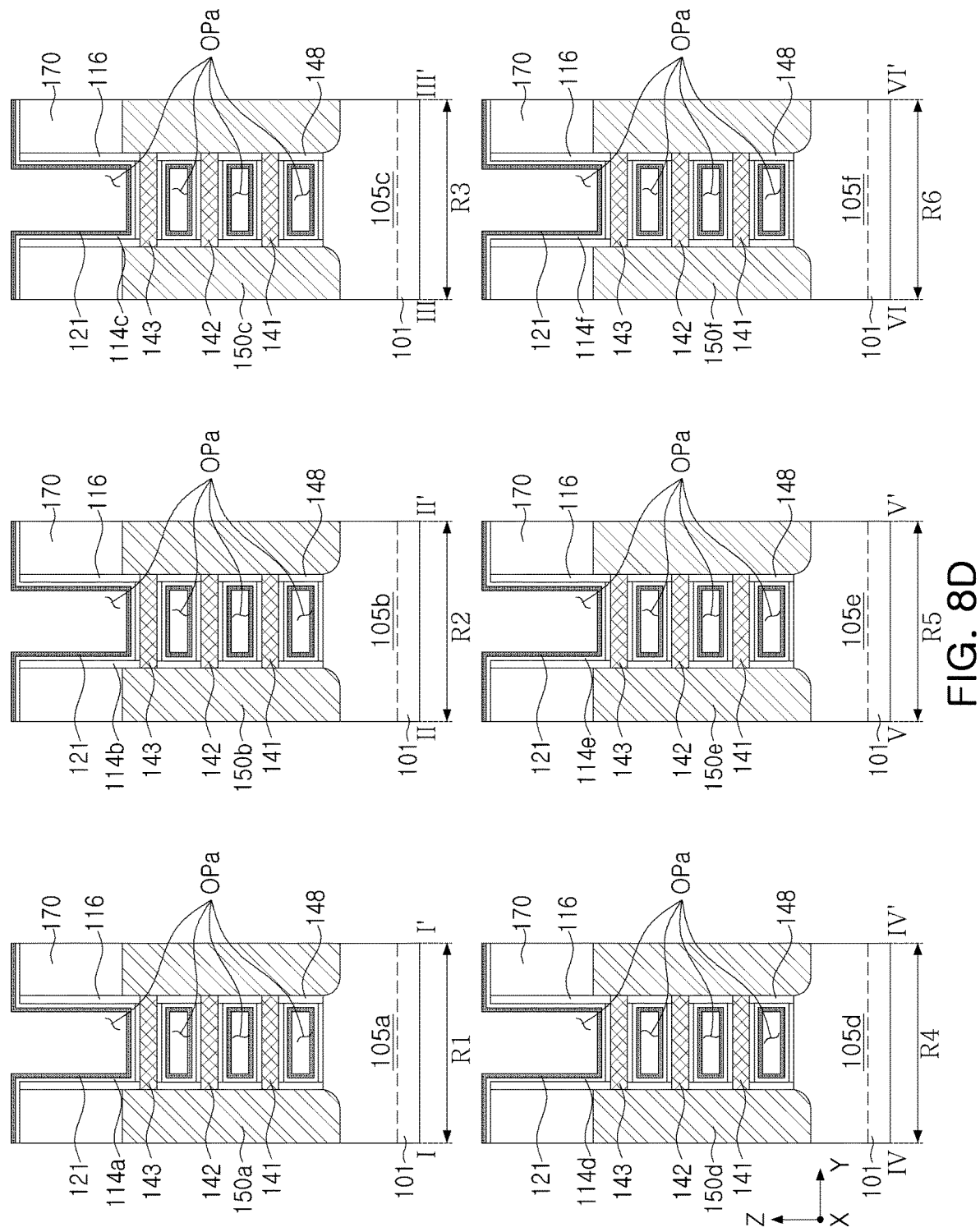

Referring to FIG. 8D, a first layer 121 may be formed in the first to sixth regions R1 to R6.

The first layer 121 may be conformally formed on the gate dielectric layers 114a to 114f in the first to sixth regions R1 to R6. Unlike what is illustrated in FIG. 6C, the first layer 121 may also be conformally formed on gate dielectric layers 114a to 114f, disposed between the channel structures 140a to 140f and the active fins 105a to 105f, between the source/drain regions 150a to 150f.

Next, the same processes as described with reference to FIGS. 6D to 7F may be performed in the same manner to manufacture the semiconductor device of FIGS. 3A and 3B. For example, a first oxidation treatment process 1 may be performed on the first to sixth regions R1 to R6 to turn TiN of the first layer 121 into TiON and the first layer 121 may be removed in the third to sixth regions R3, R4, R5, and R6. Among the first to fourth oxidation treatment processes 1, 2, 3, and 4, certain processes may be omitted according to example embodiments.

As described above, gate electrode layers of transistors may have various structures to provide various threshold voltages. Accordingly, a semiconductor device having improved electrical characteristics and a method of manufacturing the same may be provided.

While example embodiments have been shown and described above, it will be apparent to those skilled in the art that modifications and variations could be made without departing from the scope of the present inventive concept as defined by the appended claims.

What is claimed is:

1. A semiconductor device comprising:
a substrate having a first region, a second region, and a third region;
a first transistor on the first region and including a first gate dielectric layer, a first gate electrode layer on the first gate dielectric layer, and first source/drain regions on the substrate on opposite sides of the first gate electrode layer;
a second transistor on the second region and including a second gate dielectric layer, a second gate electrode layer on the second gate dielectric layer, and second source/drain regions on the substrate on opposite sides of the second gate electrode layer; and
a third transistor on the third region and including a third gate dielectric layer, a third gate electrode layer on the third gate dielectric layer, and third source/drain regions on the substrate on opposite sides of the third gate electrode layer,
wherein each of the first and second gate electrode layers comprises:
a first conductive layer;
a first upper conductive layer on the first conductive layer; and
a first internal conductive layer on the first upper conductive layer,
wherein the third gate electrode layer comprises:
a second conductive layer;
a second upper conductive layer on the second conductive layer; and
a second internal conductive layer on the second upper conductive layer,
wherein the first and second conductive layers each include a first layer and a second layer,
wherein the first conductive layer further includes a third layer and a fourth layer,
wherein the first and second conductive layers include titanium nitride (TiN),
wherein at least one of the first to fourth layers includes titanium oxynitride (TiON), and
wherein the first to third transistors are metal oxide semiconductor field effect transistors (MOSFETs) having a same channel conductivity type.

2. The semiconductor device of claim 1,
wherein in the first gate electrode layer, the first to fourth layers are stacked on the first gate dielectric layer, and
wherein in the second gate electrode layer, the first to fourth layers are stacked on the second gate dielectric layer.

3. The semiconductor device of claim 2,
wherein the first and second gate dielectric layers include a common material, and
wherein the second gate dielectric layer further includes at least one of lanthanum (La), gadolinium (Gd), ruthenium (Ru), yttrium (Y), or scandium (Sc) that is absent from the first gate dielectric layer.

4. The semiconductor device of claim 3,
wherein the first layer of the first transistor and the second layer of the second transistor include TiON, and
wherein a threshold voltage of the first transistor is smaller than a threshold voltage of the second transistor.

5. The semiconductor device of claim 3,
wherein the first and second layers of the first transistor, the first and second layers of the second transistor, and the second layer of the third transistor include TiON,
wherein a threshold voltage of the first transistor is smaller than a threshold voltage of the second transistor, and
wherein the threshold voltage of the second transistor is smaller than a threshold voltage of the third transistor.

6. The semiconductor device of claim 3,
wherein the first to third layers of the first transistor, the first to third layers of the second transistor, and the second layer of the third transistor include TiON,
wherein a threshold voltage of the first transistor is smaller than a threshold voltage of the second transistor, and
wherein the threshold voltage of the second transistor is smaller than a threshold voltage of the third transistor.

7. The semiconductor device of claim 1,
wherein a width of the first upper conductive layer is smaller than a width of the second upper conductive layer, and
wherein a width of the first internal conductive layer is smaller than a width of the second internal conductive layer.

8. The semiconductor device of claim 1,
wherein some of the first to fourth layers of the first transistor, other than the at least one of the first to fourth layers of the first transistor, include TiON,
wherein the first and second layers of the third transistor include TiN, and
wherein a threshold voltage of the first transistor is about 10 millivolts (mV) to about 60 mV smaller than a threshold voltage of the third transistor.

9. The semiconductor device of claim 1,
wherein the first and second upper conductive layers include titanium aluminum carbide (TiAlC), and
wherein the first and second internal conductive layers include TiN.

10. The semiconductor device of claim 9,
wherein at least a portion of each of the first and second conductive layers and at least a portion of each of the first and second upper conductive layers has a U shape,
wherein at least a portion of each of the first and second internal conductive layers has a non-U shape, and
wherein the semiconductor device further comprises:
first to third interface layers below the first to third gate dielectric layers, respectively;
gate spacer layers on opposite exterior sidewalls of the first to third gate electrode layers; and
gate capping layers on respective upper surfaces of the first to third gate electrode layers.

11. The semiconductor device of claim 1,
wherein the substrate further has a fourth region, a fifth region, and a sixth region,
wherein the semiconductor device further comprises:
a fourth transistor on the fourth region and including a fourth gate dielectric layer, a fourth gate electrode layer on the fourth gate dielectric layer, and fourth source/drain regions on the substrate on opposite sides of the fourth gate electrode layer;
a fifth transistor on the fifth region and including a fifth gate dielectric layer, a fifth gate electrode layer on the fifth gate dielectric layer, and fifth source/drain regions on the substrate on opposite sides of the fifth gate electrode layer; and
a sixth transistor on the sixth region and including a sixth gate dielectric layer, a sixth gate electrode layer on the sixth gate dielectric layer, and sixth source/drain regions on the substrate on opposite sides of the sixth gate electrode layer,
wherein the fourth gate electrode layer comprises:
a third conductive layer including the third and fourth layers;
a third upper conductive layer on the third conductive layer; and
a third internal conductive layer on the third upper conductive layer,
wherein each of the fifth and sixth gate electrode layers comprises:
a fourth conductive layer including the fourth layer;
a fourth upper conductive layer on the fourth layer; and
a fourth internal conductive layer on the fourth upper conductive layer,
wherein in the fourth to sixth regions, at least one of the third and fourth layers includes TiN,
wherein each of the fourth to sixth transistors is an NMOS transistor, and
wherein each of the first to third transistors is a PMOS transistor.

12. The semiconductor device of claim 11,
wherein the third layer of each of the first to fourth transistors includes TiON,
wherein the fourth layer of each of the first to fourth transistors includes TiN, and
wherein a thickness of the first conductive layer is greater than a thickness of the second conductive layer, a thickness of the third conductive layer, and a thickness of the fourth conductive layer.

13. The semiconductor device of claim 1, wherein active fins, defined by an isolation region and protruding from the substrate, are on the substrate,
wherein the active fins intersect the first to third gate electrode layers and extend in at least one direction, and
wherein the first to third source/drain regions are on the active fins on the opposite sides of the first to third gate electrode layers.

14. The semiconductor device of claim 13, further comprising:
a plurality of channel layers on the active fins and spaced apart from each other in a vertical direction,
wherein the first to third gate electrode layers are between the active fins and the plurality of channel layers, and are on and between the plurality of channel layers.

15. A semiconductor device comprising:
a substrate having a first region and a second region;
a first gate electrode layer on the first region and including a first conductive layer including a first plurality of layers, and the first gate electrode layer including a first upper conductive layer on the first conductive layer;
a second gate electrode layer on the second region and including a second conductive layer including a second plurality of layers, and the second gate electrode layer including a second upper conductive layer on the second conductive layer;
a first gate dielectric layer on a lower surface and a side surface of the first conductive layer; and
a second gate dielectric layer on a lower surface and a side surface of the second conductive layer,
wherein the first and second gate dielectric layers include a common material,
wherein the second gate dielectric layer further includes at least one of lanthanum (La), gadolinium (Gd), ruthenium (Ru), yttrium (Y), or scandium (Sc) that is absent from the first gate dielectric layer,
wherein the first plurality of layers and the second plurality of layers include equal numbers of layers,
wherein at least one of the first plurality of layers includes titanium oxynitride (TiON),
wherein a first transistor including the first gate electrode layer and a second transistor including the second gate electrode layer are metal oxide semiconductor field effect transistors (MOSFETs) having a same channel conductivity type, and
wherein a threshold voltage of the first transistor is smaller than a threshold voltage of the second transistor.

16. The semiconductor device of claim 15,
wherein in the first gate electrode layer, each of the first plurality of layers has a first base portion and a pair of protruding portions that protrude upward from the first base portion away from the substrate, and
wherein each of the first and second upper conductive layers has a second base portion and a pair of protruding portions that protrude upward from the second base portion away from the substrate.

17. A semiconductor device comprising:
a substrate having a first region, a second region, and a third region;
a first gate structure on the first region and including a first gate dielectric layer, a first conductive layer on the first gate dielectric layer, and a first upper conductive layer on the first conductive layer;
a second gate structure on the second region and including a second gate dielectric layer, a second conductive layer on the second gate dielectric layer, and a second upper conductive layer on the second conductive layer; and
a third gate structure on the third region and including a third gate dielectric layer, a third conductive layer on the third gate dielectric layer, and a third upper conductive layer on the third conductive layer,
wherein each of the first to third conductive layers includes one or a plurality of first layers including titanium nitride (TiN),
wherein the first and second conductive layers further include one or a plurality of second layers including titanium oxynitride (TION), and
wherein a thickness of the first conductive layer is smaller than a thickness of the third conductive layer.

18. The semiconductor device of claim 17, wherein a lower portion of the first gate structure comprises the one or the plurality of first layers of the first conductive layer.

* * * * *